United States Patent
Demers et al.

(10) Patent No.: US 9,438,710 B2
(45) Date of Patent: Sep. 6, 2016

(54) COLOR-MATCHED POLYMER MATERIALS AND METHOD FOR FORMING THE SAME

(71) Applicant: Apple Inc., Cupertino, CA (US)

(72) Inventors: Brian P. Demers, San Jose, CA (US); Peteris K. Augenbergs, San Francisco, CA (US); Brandon Scott Farmer, Huntsville, AL (US); Garrett David Poe, Madison, AL (US); Joni Leighan Kay, Huntsville, AL (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/497,857

(22) Filed: Sep. 26, 2014

(65) Prior Publication Data

US 2015/0173222 A1    Jun. 18, 2015

Related U.S. Application Data

(60) Provisional application No. 61/917,278, filed on Dec. 17, 2013, provisional application No. 61/939,518, filed on Feb. 13, 2014, provisional application No. 62/018,347, filed on Jun. 27, 2014, provisional application No. 62/035,961, filed on Aug. 11, 2014.

(51) Int. Cl.
| | |
|---|---|
| *H05K 5/00* | (2006.01) |
| *H05K 5/02* | (2006.01) |
| *H04M 1/18* | (2006.01) |
| *G06F 1/16* | (2006.01) |

(52) U.S. Cl.
CPC ............... *H04M 1/18* (2013.01); *G06F 1/16* (2013.01); *G06F 1/1613* (2013.01); *H05K 5/0021* (2013.01); *H05K 5/0243* (2013.01); *G06F 1/169* (2013.01); *H04M 2250/22* (2013.01); *Y10T 428/269* (2015.01); *Y10T 428/31935* (2015.04)

(58) Field of Classification Search
None
See application file for complete search history.

(56) References Cited

U.S. PATENT DOCUMENTS

| | | | | |
|---|---|---|---|---|
| 3,632,395 | A * | 1/1972 | Dyson | ............ B44F 9/10 106/402 |
| 4,150,942 | A * | 4/1979 | Holliger | ............ D06P 9/326 534/716 |
| 4,335,173 | A | 6/1982 | Caraballo | |
| 5,234,729 | A * | 8/1993 | Wheatley | ............ B29C 43/30 428/130 |

(Continued)

FOREIGN PATENT DOCUMENTS

WO    2013/192579    12/2013

OTHER PUBLICATIONS

International Search Report & Written for PCT/US2015/013901 dated May 14, 2015.

*Primary Examiner* — Monique Jackson
(74) *Attorney, Agent, or Firm* — Downey Brand LLP

(57) ABSTRACT

Polymer materials that are color-matched with non-polymer materials are disclosed. Methods involve incorporating the same type of dyes used to colorize the non-polymer materials within the polymer materials. In some embodiments, a solvent casting process is used, which involves dissolving a polymer material and a dye with a solvent or a combination of solvents forming a dye-polymer mixture. In some embodiments, the dye-polymer mixture is dispensed onto a carrier and the solvent is removed forming a dyed polymer layer that can be applied onto a part as a color veneer. In some embodiments, the dye-polymer mixture is dispensed into mold and the solvent is removed forming a dyed polymer structure that can be used as a stand-alone structure or as part of a larger structure.

20 Claims, 20 Drawing Sheets

(56) References Cited

U.S. PATENT DOCUMENTS

| | | | |
|---|---|---|---|
| 6,696,553 B1* | 2/2004 | Korte | C09B 43/11 106/31.44 |
| 8,031,174 B2 | 10/2011 | Hamblin et al. | |
| 2008/0026221 A1 | 1/2008 | Vincent et al. | |
| 2009/0141334 A1* | 6/2009 | Dean | G02B 26/005 359/290 |
| 2011/0097506 A1 | 4/2011 | Shah et al. | |
| 2011/0214993 A1* | 9/2011 | Akana | C25D 5/00 205/50 |

* cited by examiner

COLOR-MATCHED POLYMER MATERIALS AND METHOD FOR FORMING THE SAME

CROSS-REFERENCE TO RELATED APPLICATIONS

This application claims priority to U.S. Provisional Application Ser. No. 61/917,278 filed Dec. 17, 2013 entitled "Non-Capacitive Or Radio Frequency-Transparent Materials With Anodized Metal Appearance"; U.S. Provisional Application Ser. No. 61/939,518 filed Feb. 13, 2014 entitled "Color-Matched Polymer Materials And Method For Forming The Same"; U.S. Provisional Application Ser. No. 62/018,347 filed Jun. 27, 2014 entitled "Color-Matched Polymer Materials And Method For Forming The Same"; and U.S. Provisional Application Ser. No. 62/035,961 filed Aug. 11, 2014 entitled "Color-Matched Polymer Materials And Method For Forming The Same", each of which are incorporated herein by reference in its entirety This application claims priority to U.S. Provisional Application Ser. No. 61/917,278 filed Dec. 17, 2013 entitled "Non-Capacitive Or Radio Frequency-Transparent Materials With Anodized Metal Appearance"; U.S. Provisional Application Ser. No. 61/939,518 filed Feb. 13, 2014 entitled "Color-Matched Polymer Materials And Method For Forming The Same"; and U.S. Provisional Application Ser. No. 62/035,961 filed Aug. 11, 2014 entitled "Color-Matched Polymer Materials And Method For Forming The Same", each of which are incorporated herein by reference in its entirety.

This application is also related to U.S. patent application Ser. No. 14/190,018 filed Feb. 25, 2014 entitled "Non-Capacitive Or Radio Frequency-Transparent Materials With Anodized Metal Appearance", which is incorporated herein by reference in its entirety.

FIELD

This disclosure relates generally to methods for colorizing polymer materials, and in particular, to match a color of a non-polymer material. The methods can be used to form colored enclosures or colored portions of enclosures for electronic devices.

BACKGROUND

Many computing devices have enclosures and coverings that include metallic surfaces that give the devices an aesthetically pleasing and durable look and feel. The metallic surfaces typically have a thin passivation layer that increases the corrosion resistance and wear resistance of the metal. This thin passivation layer is generally formed using an electrolytic process called anodizing, whereby the metal part acts as an anode. During anodizing, a portion of the exposed metal is converted to a metal oxide layer, sometimes referred to as an anodic film or layer. The anodic layer can be dyed to give the metal surfaces any of a number of different colors.

Often, the enclosures for computing devices include non-metallic portions. For example, touch pad covers and radio frequency antenna windows are required to be made of non-metallic materials in order to allow proper operation of underlying touch pads and radio frequency antennas, respectively. These non-metallic portions can be made of non-capacitive and/or radio frequency transparent materials such as plastic or glass. One design challenge associated with including non-metallic portions within metal enclosures is maintaining a sleek and consistent overall metallic-looking enclosure. The non-metallic portions can be dyed to match the color of adjacent dyed anodized metal surfaces. However, it can be difficult to get an exact color match between non-metallic portions and metallic portions. This is because the non-metallic portions and the anodic layers of the metallic portions generally accept different types of dyes. The result is the dyed non-metallic portions have a slightly different color than the dyed anodized metallic surfaces, which can detract from the consistent color and continuous look of the enclosures.

SUMMARY

This paper describes various embodiments that relate to color-matched polymer materials and methods for forming the same.

According to one embodiment, a method of incorporating a water-soluble dye within a water-insoluble polymer material is described. The method includes forming a fluid dye-polymer mixture by dissolving the polymer material and the water-soluble dye within at least one solvent. The method also includes dispensing the fluid dye-polymer mixture onto a surface of a carrier. The method further includes forming a dyed polymer layer by removing the solvent from the fluid dye-polymer mixture.

According to an additional embodiment, a method of forming a composite layer having a dyed anodized metal appearance is described. The method includes forming a dyed polymer layer by solidifying a dye-polymer mixture on a carrier structure. The dyed polymer layer is translucent and has a water-soluble dye infused therein. The water-soluble dye imparting a color to the dyed polymer layer matching a color of an anodic layer having the water-soluble dye infused therein. The dyed polymer layer has a first reflection/transmission curve and the anodic layer has a second reflection/transmission curve. The first reflection/transmission curve is substantially the same as the second reflection/transmission curve. The method also includes forming a composite layer by applying an optically reflective coating on a first surface of the dyed polymer layer. The optically reflective layer has multiple visible light reflective surfaces such that the optically reflective layer appears as a metal substrate underlying the dyed polymer layer.

According to another embodiment, a dyed polymer layer is described. The dyed polymer includes a water-insoluble solid polymer material. The solid polymer material can be opaque, partially opaque or translucent/transparent. The dyed polymer also includes a water-soluble dye incorporated within the solid polymer material such that dyed polymer structure has a color corresponding to a color of the water-soluble dye.

According to a further embodiment, a method of forming a dyed polymer layer having a color substantially the same as a dyed anodic layer is described. The method includes forming a fluid dye-polymer mixture by dissolving at least one polymer and at least one dye within at least one solvent. The dye is the same type of dye as an anodic dye within the dyed anodic layer. The method also includes dispensing the fluid dye-polymer mixture onto a surface of a carrier structure. The method further includes forming a dyed polymer layer by removing the solvent from the fluid dye-polymer mixture. The fluid dye-polymer mixture solidifies into the dyed polymer structure when the solvent is removed.

According to another embodiment, an enclosure for an electronic device is described. The enclosure includes a metallic portion having an anodized surface. The anodized surface has a dyed anodic film with an anodic dye infused therein. The dyed anodic film is characterized as having a first spectral reflection/transmission curve when illuminated by a first light source. The enclosure also includes a dyed polymer portion having the anodic dye infused therein. The dyed polymer portion is characterized as having a second spectral reflection/transmission curve when illuminated by the first light source. The first spectral reflection/transmission curve is substantially the same as the second spectral reflection/transmission curve.

According to an additional embodiment, a laminated stack up is described. The laminated stack up includes a first protective cover made of a first material. The first protective cover has a first surface with an optically reflective layer adhered thereto. The laminated stack up also includes a second protective cover made of a second material that is substantially transparent. The second protective cover has a second surface corresponding to a viewing surface of the laminated stack up. The laminated stack up also includes a dyed polymer layer disposed between the first protective cover and the second protective cover. The dyed polymer layer is substantially translucent and has an anodic dye infused therein. The optically reflective layer is viewable through the dyed polymer layer and the second protective cover as viewed from the viewing surface giving the laminated stack up an appearance of a dyed anodized metal.

These and other embodiments will be described in detail below.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
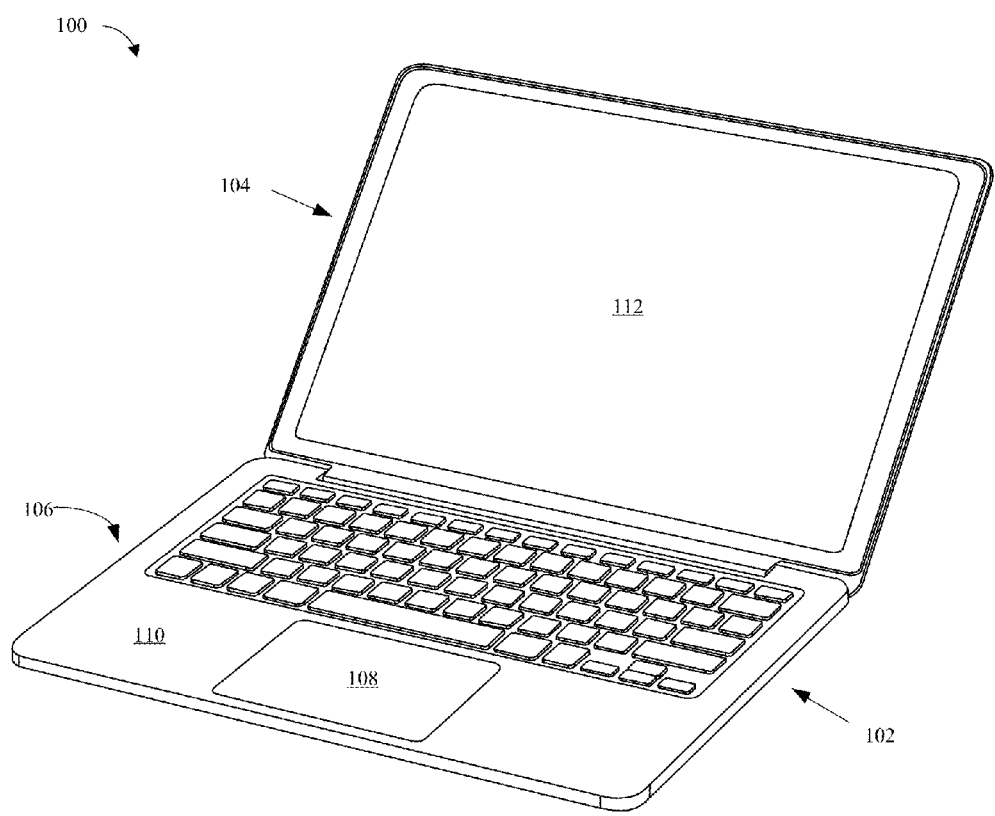
FIG. 1 shows a perspective view of laptop computer, which includes non-metallic portions that can be colorized to match dyed anodized metal portions using methods described herein.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates to colorizing polymer materials such that they match a color of a non-polymer material. In a particular embodiment, the polymer materials are colorized to match the color of dyed anodized metal surfaces. In some applications, the color-matched polymer materials are positioned adjacent dyed anodized metal surfaces on a part to give the part a uniformly colored appearance. The color-matched polymer materials can form exterior portions of enclosures, such as enclosures for consumer electronic products. For example, the color-matched polymer materials can be manufactured into enclosures for computers, portable electronic devices and electronic computer accessories, such as those manufactured by Apple Inc., based in Cupertino, Calif.

In some embodiments, the color-matched polymer materials are formed into thin layers that can be used to cover visible portions of a part. In a particular embodiment, the thin polymer layers simulate the color of a dyed anodic oxide layer. The thin polymer layers can be opaque or partially opaque. The polymer material can be dyed with the same dye used to dye the anodic oxide layer, thereby creating a substantially identical color match with the anodic oxide layer. An optically reflective layer can be applied to the back of the color-matched polymer layer forming a composite layer. The optically reflective layer simulates the appearance of an underlying metal such that the composite layer has the appearance of a colored anodized metal surface. The composite layer can be applied to exterior portions of a part that are adjacent to dyed anodized metal portions of the part giving the part a uniformly colored anodized metal appearance. In one application, the composite layer is used to form exterior portions of touch pads of electronic devices. In another application, the color-matched composite layer is used to form exterior portions of radio frequency (RF) windows of electronic devices. In some embodiments, a protective cover, such as a layer of plastic or glass, is adhered to a top surface of the color-matched polymer layer.

In addition to thin film applications, the color-matched polymer materials can be shaped into bulk polymer structures that can be used to form larger structures than thin films or layers. The bulk polymer structures can be shaped into any suitable form. For example, the color-matched polymer materials can be shaped to form sections of an enclosure or to form substantially an entire enclosure. The shaping can be accomplished using molding, machining, finishing or other suitable techniques. The bulk polymer structures can be opaque or partially opaque.

These and other embodiments are discussed below with reference to FIGS. 1-9. However, those skilled in the art will readily appreciate that the detailed description given herein with respect to these Figures is for explanatory purposes only and should not be construed as limiting.

FIG. 1 shows a perspective view of laptop computer 100, which includes base portion 102 and lid 104. Base portion 102 has top surface 106, which includes track pad 108 surrounded by top case 110. Track pad 108 includes a tactile sensor that is sensitive to a user's finger. The sensor translates the motion and position of the user's finger to a relative position of a pointer displayed on screen 112. In some cases, track pad 108 operates using capacitive sensing, which requires that the top surface of track pad 108 be made of non-conductive or non-capacitive material such as glass and/or plastic. The top surface of track pad 108 can be smooth and polished, or it can be textured to have an etched look and feel. In some cases, top case 110 is made of an anodized metal such as an anodized aluminum or anodized aluminum alloy. In some cases, the anodized metal is dyed giving top case 110 a particular color. Thus, top surface 106 can have a dyed anodized metal surface portion corresponding to dyed anodized metal top case 110 and a non-metal surface portion corresponding to track pad 108. Methods described herein can be used to provide track pad 108 a color that matches the color of surrounding dyed anodized metal top case 110 while still having the necessary non-capacitive surface for proper track pad operation. In some embodiments, methods involve providing track pad 108 a colored metallic-looking surface that matches dyed anodized metal top case 110.

Figure 2:
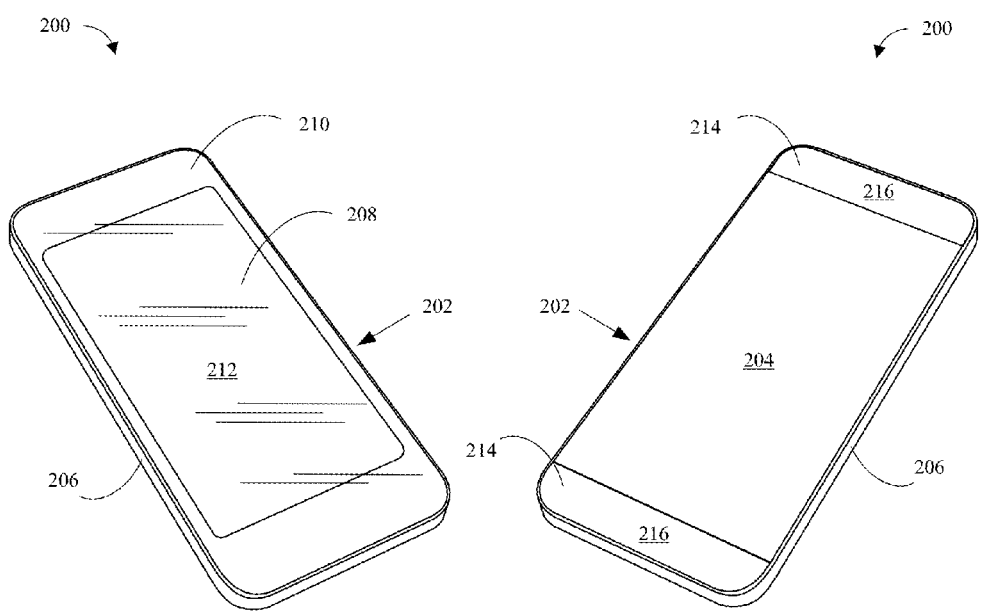
FIG. 2 shows perspective top and bottom views of a mobile phone, which includes non-metallic portions that can be colorized to match dyed anodized metal portions using methods described herein.

In some embodiments, the color-matched non-metallic portions are part of a display screen or a radio frequency (RF) transparent window for an electronic device. FIG. 2 shows perspective top and bottom views of mobile phone 200. Mobile phone 200 includes enclosure 202 designed to house internal electronic components. Enclosure 202 includes back portion 204 and side portions 206 that can have dyed anodized metal surfaces, such as dyed anodized aluminum or dyed anodized aluminum alloy. Mobile phone includes display 208, which displays output of mobile phone 200, such as graphic images and text. Display 208 can be a touch screen display that collects touch input from a user. Display 208 is surrounded by frame portion 210 that typically does not display images or text. Covering both display 208 and frame portion 210 is transparent cover 212, which is made of a transparent material such as glass or plastic. Transparent cover 212 may have a polished top surface, as shown in FIG. 2, or it may have a textured look and feel. Methods described herein can be used to provide frame portion 210 a color that matches the color of one or both dyed anodized metal back portion 204 and dyed anodized metal side portions 206. In some embodiments, methods involve providing frame portion 210 a colored metallic-looking surface that matches dyed anodized metal back portion 204 and/or dyed anodized metal side portions 206.

Mobile phone 200 includes RF antennas 214 positioned within housing 202. Antennas 214 transmit and receive RF signals to and from mobile device 200. In order to allow transmission of RF signals, RF windows 216 that cover antennas 214 are made of RF transparent material. Typical RF window 216 materials are non-conductive materials such as glass, plastic or ceramic. Methods described herein can be used to provide RF windows 216 a color that matches the color of one or both dyed anodized metal back portion 204 and dyed anodized metal side portions 206. In some embodiments, the methods involve providing RF windows 216 a colored metallic-looking surface that matches dyed anodized metal back portion 204 and/or dyed anodized metal side portions 206.

Note that FIGS. 1 and 2 are provided as exemplary implementations of the techniques described herein. The techniques provided herein can be used to provide non-metallic color-matched portions in any suitable structures and devices. For example, methods described herein can be used to form color-matched portions for stand-alone track pads that have Bluetooth connectivity to associated computing devices. The color-matched portions will be non-capacitive allowing for track pad operation, as described above with reference to FIG. 1, and will allow Bluetooth wireless transmission to and from an associated computing device. In addition, the methods described herein can be used to form non-metallic color-matched portions of a structure that requires low thermal capacitance. For example, the non-metallic color-matched portions can be part of a low thermal capacitance carbon fiber or fiberglass part.

Figure 3:
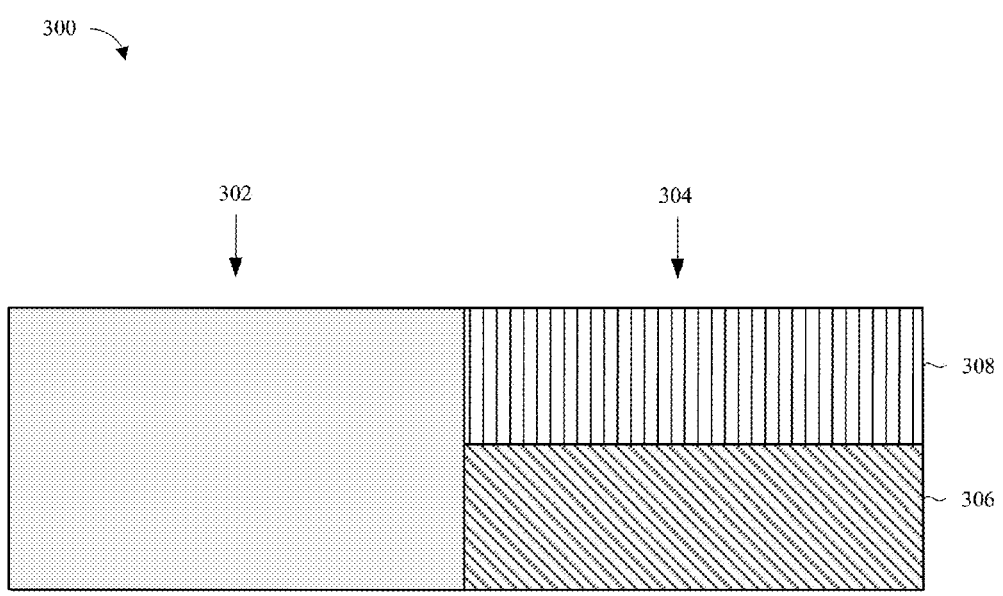
FIG. 3 shows a cross-section view of a part having an anodized metal portion and a polymer portion.

Generally, exposed surfaces of metal parts such as aluminum and aluminum alloy parts, are exposed to an anodizing process forming a thin coating of metal oxide formed thereon, sometimes referred to as an anodic layer or anodic film. Anodic layers increase corrosion resistance and wear resistance of the exposed metal surfaces. Thus, the anodized metal surfaces of devices 100 and 200 described above have a thin metal oxide coating. To illustrate, FIG. 3 shows a close-up cross-section view of part 300. Part 300 includes polymer portion 302 adjacent to anodized metal portion 304. Polymer portion 302 is non-capacitive and RF-transparent, and therefore can be used to cover track pads, RF antennas and other operative components of part 300. Anodized metal portion 304 includes metal substrate 306 and oxide layer 308 formed thereon. Oxide layer 308 can be formed using an anodizing process where metal substrate 306 is exposed to an electrolytic process that converts exposed portions of metal substrate 306 to a corresponding metal oxide. For example, aluminum and aluminum alloy substrates can be anodized to form aluminum oxide coatings. Examples of anodizable metal substrates include aluminum, titanium, magnesium, niobium, zirconium, hafnium, tantalum, and alloys made thereof.

Oxide layer 308 has a porous microstructure that allows for insertion of dyes within the pores of oxide layer 308. These dyes can impart a color to oxide layer 308 and give anodized metal portion 304 a corresponding color. Alternatively or additionally, metal particles can be deposited within the pores of oxide layer 308 using electrolytic deposition to provide a range of colors from pale gold to black. Since oxide layer 308 is very thin, typically about 5 to 20 micrometers, oxide layer 308 is generally transparent, partially transparent or translucent, thereby revealing underlying metal substrate 306 and giving anodized metal portion 304 a colored metallic look. Note that as described herein, a transparent material refers to a material that allows substantially all visible light to pass such that an underlying substrate or material is fully visible therethrough. As described herein, a partially transparent material or translucent material refers to a material that allows some visible light to pass such that an underlying substrate or material is partially visible therethrough.

Polymer portion 302 can be dyed to match the color of dyed oxide layer 308. However, different types of dyes are generally used to color oxide layer 308 and polymer portion 302. This is because of the different chemical nature of an anodic oxide layer and a polymer material. For example, water-insoluble polymer materials generally do not accept water-soluble dyes using traditional techniques. Traditional techniques for incorporating water-soluble dyes within polymer portion 302 would result in the water-soluble dye to be driven away by the temperatures at which polymer materials are cast or extruded. Thus, traditional color matching techniques involve coloring polymer portion 302 with a different type of dye than the dye used to color dyed oxide layer 308 but that closely matches the color of dyed oxide layer 308. For example, a water-soluble dye can be used to dye oxide layer 308 and an organic dye having a similar color as the water-soluble dye can be used to color polymer portion 302. Unfortunately, different types of dyes can have different spectral reflection/transmission curves, which can cause polymer portion 302 to appear a different color than dyed oxide layer 308 when illuminated with different light sources.

Figure 4A:
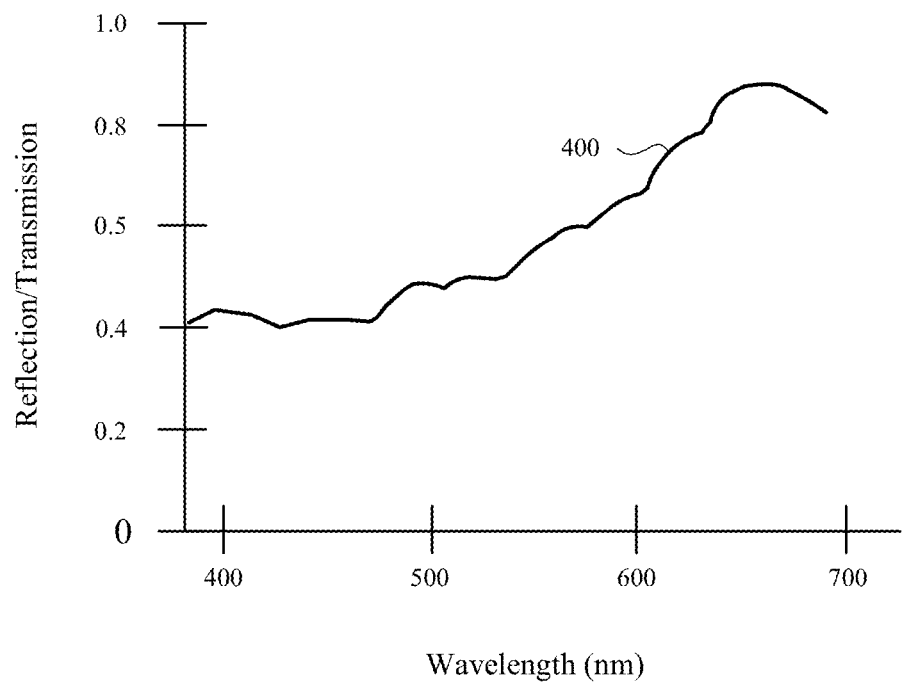
FIGS. 4A and 4B show a spectral reflection/transmission spectrum of an object illuminated under standard daylight illumination conditions and representations of the x, y, z observers used to simulate human vision in response to spectral stimuli of the object.
Figure 4B:
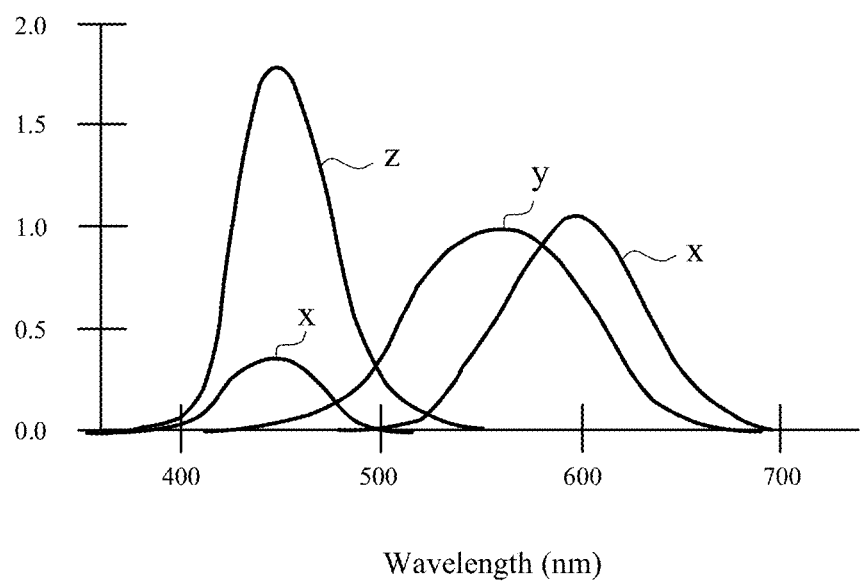
Figure 4C:
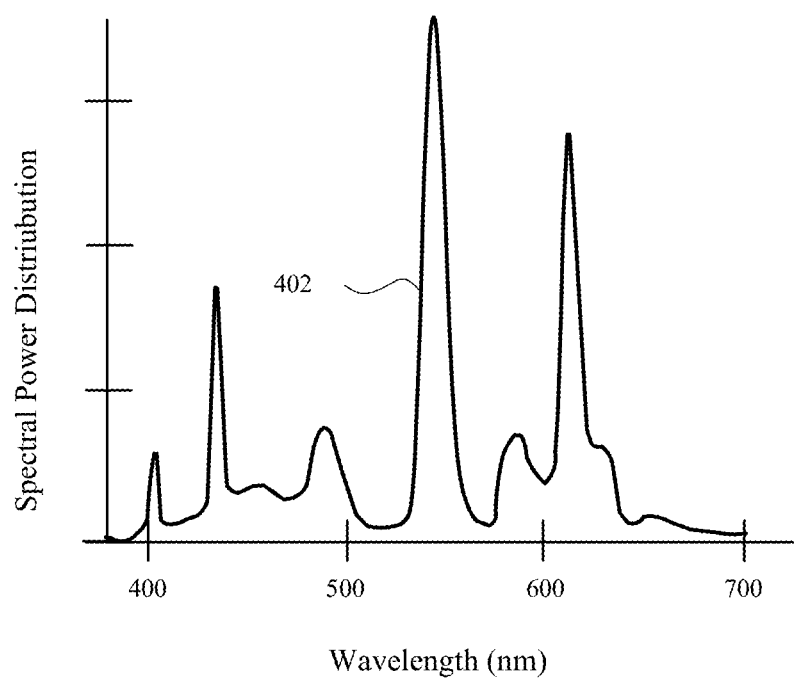
FIG. 4C shows a spectral power distribution curve of a fluorescent light source.
Figure 4D:
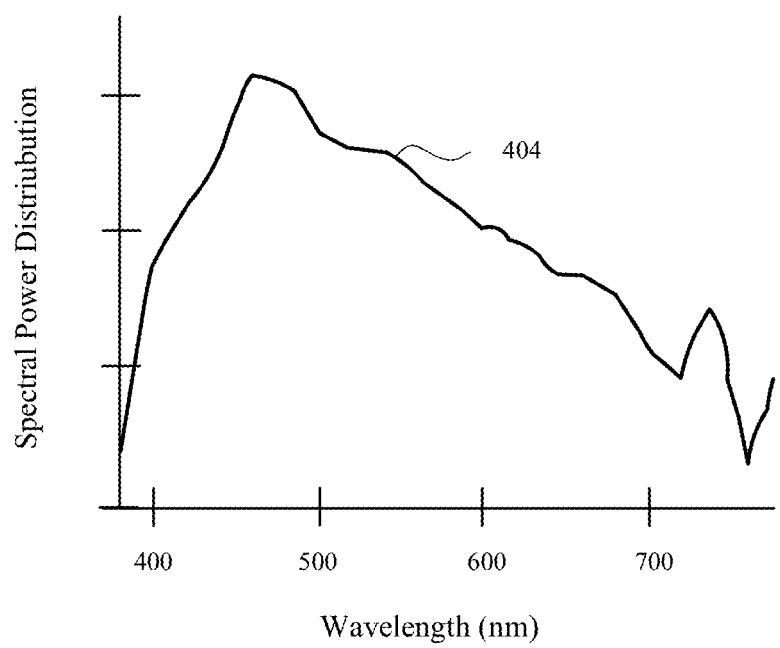
FIG. 4D shows a spectral power distribution curve of a D65 light source.

To illustrate, FIG. 4A shows a spectral reflection/transmission curve 400 of a first object illuminated under standard daylight illumination conditions (D65 light source). FIG. 4B shows a normalized response curve plot that represents x, y and z observer values used to simulate human vision response to spectral stimuli of the first object. A second object will have a perceived color match with the first object if the observer values of the second object match the observer values of the first object. However, objects can appear to match in color when viewed under one light source while they do not appear to match when viewed under a different light source. This is because different light sources have different spectral power distributions. This is demonstrated by FIGS. 4C and 4D. FIG. 4C shows spectral power distribution curve 402 of a fluorescent light source, while FIG. 4D shows spectral power distribution curve 404 of a D65 light source. The perceived color of an object is a product of the reflection/transmission of the object and the spectral power distribution of the light source shining on the object as interpreted by the x, y, z observers. Thus, consistent matching of perceived colors of two objects involves color matching the two objects such that they have substantially the same reflection/transmission curve when exposed to different sources of light. Since dyes traditionally used to color polymer materials are often chemically different from the dyes used in anodic layers, it can be difficult to achieve color matching under different illumination sources. In particular, it has even been found that water-soluble and non-water-soluble dyes derived from the same dyestuff can have different reflection/transmission curves.

In order to match the color of dyed anodic layers, methods described herein involve incorporating the same dye used to colorize an anodic layer into a polymer material. In this way, the polymer material will substantially match the color of the anodic layer, even under different lighting conditions. In some embodiments, a solvent casing process is used. The solvent used in the solvent casting process is capable of dissolving both the anodic layer dye and the polymer material. Once the anodic layer dye and polymer are sufficiently mixed, the solvent can be removed, leaving a polymer material that has the anodic layer dye incorporated inside the polymer material.

Figure 5C:
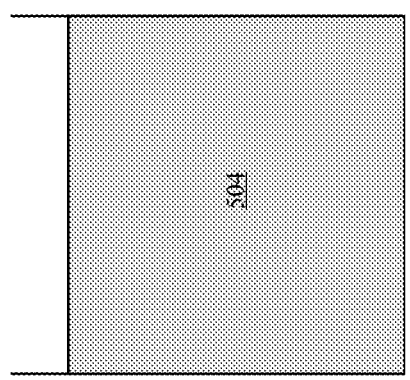
FIGS. 5A-5C show formation of a dye-polymer mixture that can be used in a solvent casting process in accordance with some embodiments.
Figure 5B:
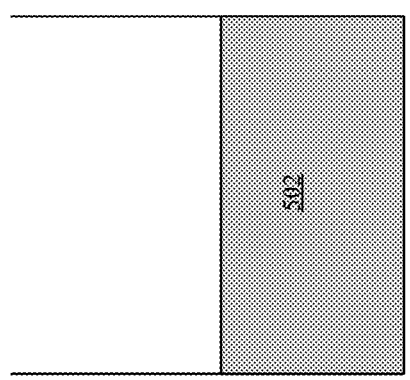
Figure 5A:
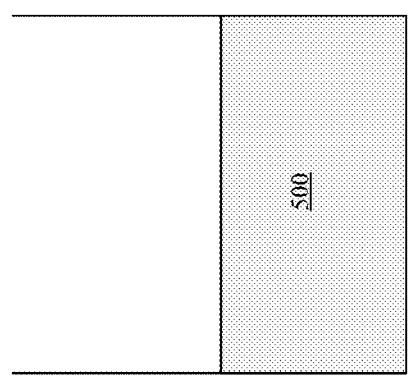

FIGS. 5A-5C show part of a solvent casting process in accordance with some embodiments. At FIG. 5A, a first mixture 500 is formed by dissolving a polymer into a solvent. The polymer can be chosen for its physical characteristics, such as hardness, rigidity, flexibility, elasticity and/or light transparency. Any suitable polymer and suitable solvent can be used. In some embodiments, a combination of polymers is used. In some embodiments, the solvent is chosen for its ability to dissolve a chosen polymer into solution, as well as its ability to dissolve a chosen dye into solution. In some embodiments, it is preferable that the polymer be substantially entirely dissolved within the solvent or solvents such that no precipitate or particles come out of solution. If a water-soluble dye is used, the solvent system should be capable of dissolving both the water-soluble dye and the polymer. In some embodiments, a combination of solvents is used. In some cases, the solid form of the polymer is broken up into small pieces in order to assist the dissolving process. In some embodiments, the polymer is broken up into a power form. If appropriate, mixture 500 can be heated and/or agitated (e.g., using a mixer, stir bar, stir blades, rolling, ball milling) to assist dissolving of the polymer pieces. If agitated, mixture 500 can agitated for any suitable time period until mixture 500 is suitably consistent. In particular embodiments, mixture 500 is agitated for a number of hours.

Suitable polymer materials can include substantially any solvent-castable film forming polymers, including polycarbonate (PC), polyvinyl butyral (PVB), polyvinyl alcohol (PVA), polyvinyl acetate (PVAc), polyurethane (PU), polyureas, polycyclic olefin copolymer (COC), polymethyl methacrylate (PMMA), polyethyl methacyrlate (PEMA), acrylate copolymers, polyvinylidine fluoride (PVDF), polyimides, copolymers of the afore-mentioned, and mixture thereof. Suitable solvents can include dimethylacetamide (DMAc), water, toluene, benzene, xylene, mesitylene, ethylbenzene, dimethylsulfoxide (DMSO), diethylsulfoxide, N,N-dimethylformamide (DMF), N,N-diethylformamide, N,N-diethylacetamide, N-methyl-2-pyrrolidone (NMP), N-cyclohexyl-2-pyrrolidone, 1,3-dimethyl-2-imidazolidinone, diethyleneglycol dimethoxyether, o-dichlorobenzene, dichloromethane, chloroform, phenols, cresols, xylenol, catechol, butyrolactones, hexamethylphosphoramide, acetone, methyl ethyl ketone, methyl ethyl ketone, methyl isobutyl ketone, cyclopentanone, acetyl acetone, tetrahydrofuran, 1,4-dioxane, and mixtures thereof. In a particular embodiment, mixture 500 includes PVB dissolved in a solvent combination of DMAc and toluene. The ratio of polymer material(s) and solvent(s) can vary depending upon factors such as solubility of the polymer(s) within the solvent(s) and a desired viscosity of mixture 500.

At 5B, a second mixture 502 is formed by dissolving a dye within a solvent. As described above, the dye can be the same type of dye used to colorize a non-polymer material, such as an anodic layer. In some embodiments, the dye is a water-soluble dye. The solvent can be the same solvent used above in 5A for dissolving the polymer, or the solvent can be a different solvent. In some embodiments, a combination of solvents is used. In some cases, the solvent is heated and/or agitated to assist the dissolving of the dye. In some embodiments, mixture 502 is agitated for a number of hours. In some embodiments, it is preferable that the dye be substantially entirely dissolved within the solvent or solvents such that no precipitate or particles come out of solution. Any suitable type of dye can be used. In some embodiments, a dye that is non-chemically reactive with the polymer is used. In some embodiments, the dye will not change color during a subsequent heating and solvent removal process. As described above, in some cases a water-soluble dye corresponding to a water-soluble dye used to dye an anodic film is used. If the dye is a water-soluble dye, the solvent should be polar enough to dissolve the water soluble dye yet is able to dissolve the polymer material. In some embodiments, the water-soluble dye is derived from a dyestuff that not water-soluble. In particular, embodiments, suitable dyes include Black 402, Orange 301, Fast Bronze, Black 411, Red Dye 102 or a combination thereof. If the dye(s) are water soluble, suitable solvents can include water (e.g., deionized water) and/or other polar solvents. The ratio of dye(s) and solvent(s) can vary depending upon factors such as solubility of the dye(s) within the solvent(s) and a desired viscosity of mixture 502. Note that methods described herein can be used to combine anodizing dyes, which are typically water soluble, in any suitable polymer material. In addition, methods described herein can be used to combine any suitable water-soluble dye in a water-insoluble polymer material.

At FIG. 5C, first mixture 500 and second mixture 502 are combined to create dye-polymer mixture 504, which includes the polymer(s) and the dye(s) dissolved within the solvent(s). As described above, first mixture 500 and second mixture 502 can include the same or different solvent or solvents. In some embodiments, it is preferable that dye-polymer mixture 504 does not include precipitates or particles that come out of solution during the mixing process. If appropriate, dye-polymer mixture 504 can be heated and/or agitated to assist proper mixing and proper consistency. In some embodiments, the consistency of dye-polymer mixture 504 is fluid enough such that mixture 504 can flow onto a carrier support structure or mold during a subsequent dispensing and/or shaping operation. Note that in some embodiments, the dye is dissolved directly into first mixture 500 described above instead of separate second mixture 502. That is, the dye can be directly added and incorporated into mixture 500 forming dye-polymer mixture 504. In other embodiments, mixture 502 is formed first by dissolving the dye(s) into a solvent(s), and then the polymer material is dissolved into mixture 502 forming dye-polymer mixture 504. Dye-polymer mixture 504 can now be used to form a thin dyed polymer layer or a larger dyed polymer structure, which will be described in detail further below.

Figure 5D:
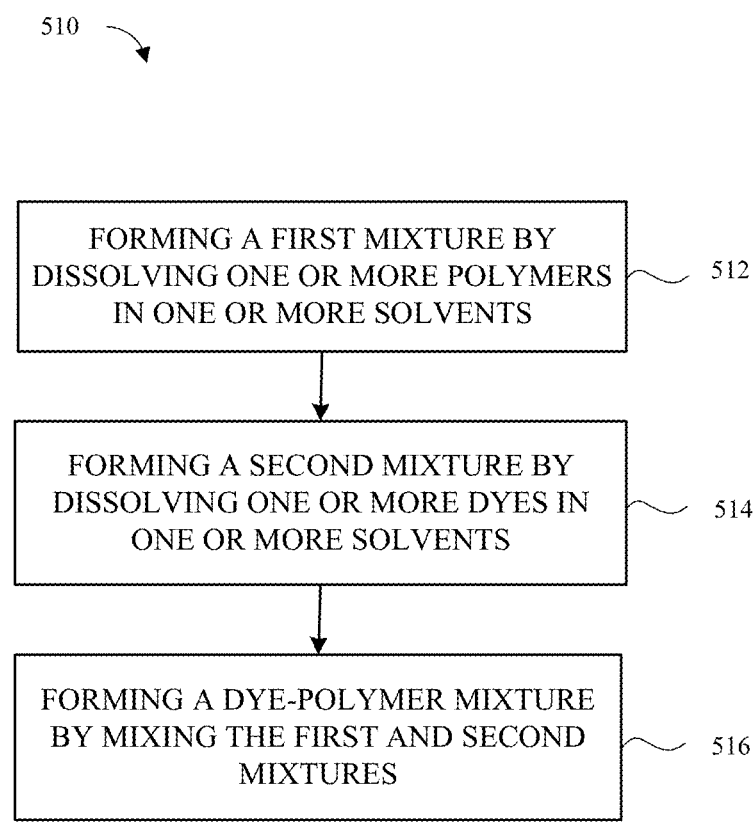
FIG. 5D shows a flowchart indicating a formation of a dye-polymer mixture, corresponding to FIGS. 5A-5C.

FIG. 5D shows flowchart 510 indicating formation of a dye-polymer mixture corresponding to FIGS. 5A-5C described above. At 512, dissolving one or more polymers in one or more solvents forms a first mixture. In some embodiments, the polymer(s) are substantially fully solvated and the first mixture is substantially free of precipitates. The polymer(s) can be any suitable polymer(s) having desired physical characteristics when in solid form, such as a predetermined amount of hardness, rigidity, durability, flexibility, elasticity, and/or light transparency.

At 514, dissolving one or more dyes in one or more solvents forms a second mixture. Note that in alternative embodiments, the dye(s) are mixed directly within the first mixture. In other embodiments, the second mixture of dye(s) within one or more solvent is prepared first and the polymer(s) are added directly within the second mixture. At 516, the first mixture and the second mixture are mixed together forming a dye-polymer mixture. The dye-polymer mixture can be further agitated and/or heated to fully incorporate the dye(s) and the polymer(s). The dye-polymer mixture can be in a form sufficiently fluid to be used in a subsequent casting process. Once the dye-polymer mixture is formed, the dye-polymer mixture can be used to form a thin layer of dyed polymer material that can be applied to a part as a color veneer, or the dye-polymer mixture can be used to form a dyed polymer structure that can serve as a stand-alone support structure or as part of a larger structure. Embodiments where the dye-polymer mixture is used to form a thin dyed polymer layer is described below with reference to FIGS. 6A-6E and 7A-7E. Embodiments where the dye-polymer mixture is used to form a larger dyed polymer structure is described below with reference to FIGS. 8A-8E.

FIGS. 6A-6D show cross-section views of formation of a dyed polymer layer that can be used as a color veneer. At FIG. 6A, dye-polymer mixture 504 is dispensed as thin layer 602 onto carrier 604. Carrier 604 can be any structure suitable for supporting layer 602 and can be made of any suitable material. In some embodiments, carrier 604 is made of material that allows for easy removal of layer 602 after a subsequent solvent removal process. That is, a material that does not stick to layer 602. In a particular embodiment, carrier 604 is made of a polymer material, such as polyethylene terephthalate (PET). In other embodiments, carrier 604 is made of a heat retaining material such as metal. In some embodiments, carrier 604 has a flat top surface or substantially planar shape. In other embodiments, carrier 604 has a three-dimensional shape that to provide a three-dimensional shape, such as a curved shape, to a resultant dyed polymer layer. In a particular embodiment, layer 602 is applied onto carrier 604 as a very thin layer, on the order of a thickness of an anodic layer. In some embodiments, dye-polymer mixture 504 is spun onto carrier 604 in order to form a very thin uniform layer 602.

Figure 6A:
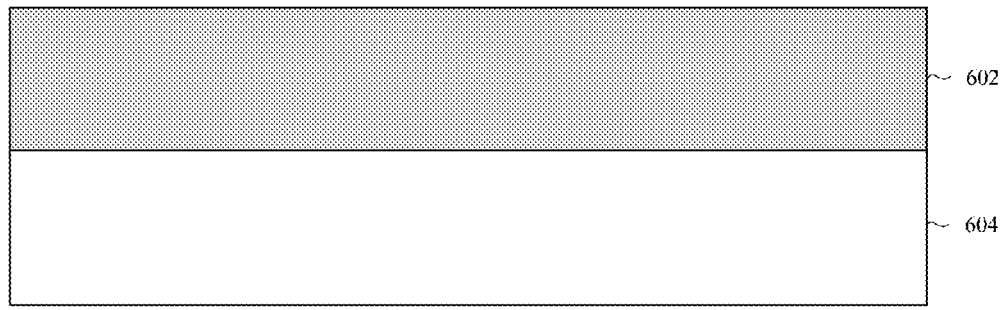
FIGS. 6A-6D show cross-section views of a dyed polymer layer formed using processes in accordance with some embodiments.
Figure 6B:
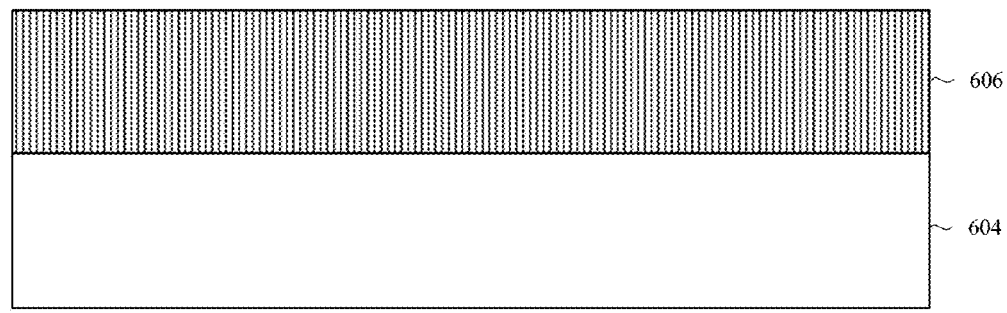

At FIG. 6B, the solvent is removed from layer 602 leaving solidified dyed polymer layer 606 on carrier 604. A solvent removal process can be used to remove substantially all of the solvent from layer 602. Solvent removal can occur by evaporation assisted by any suitable methods, such as by heating, exposure to vacuum conditions, or both. In some cases, the heating involves curing layer 602. That is, the heating can additionally strengthen dyed polymer layer 606 during the solvent removal process. If a heating process is used, layer 602 should be heated to a temperature sufficient to remove the solvent but not so high as to destroy or substantially degrade dyed polymer layer 606 or adversely affect the quality/color of the contained dye. In one embodiment, layer 602 and carrier 604 are placed in an oven to remove the solvent and cure layer 602. In some embodiments, carrier 604 is made of a material that can retain heat, such as a metal, such that heat can be applied to carrier 604, and in turn, to layer 602 to assist evaporation of the solvent. The rate of solvent removal will depend on a number of factors such as the type and the amount of solvent. In general, the thinner layer 602 is, the more readily the solvent can be removed. For thicker applications, the solvent removal and/or curing processes can take longer in order to sufficiently remove solvent from portions of layer 602 near carrier 604.

Figure 6C:
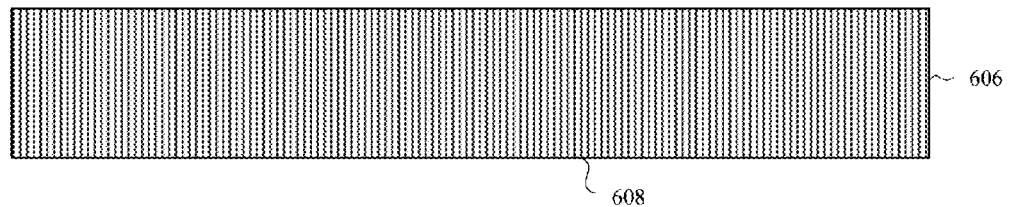

At FIG. 6C, dyed polymer layer 606 is removed from carrier 604. Dyed polymer layer 606 has dye captured therein that gives dyed polymer layer 606 a color corresponding to the color of the dye. The final thickness of dyed polymer layer 606 can vary depending on the application. Dyed polymer layer 606 can have any suitable hardness, rigidity, flexibility, and elasticity characteristics. Thinner layers of dyed polymer layer 606 can be used in of a roll-to-roll process, wherein dyed polymer layer 606 is rolled onto a substrate as a cosmetic color veneer. In some embodiments, dyed polymer layer 606 can be transparent, partially transparent or translucent to visible light. If dyed polymer layer 606 is transparent, partially transparent or translucent, an opaque layer or backing layer (not shown), such as a white coating, can be applied to surface 608 of dyed polymer layer 606 to make dyed polymer layer 606 appear more opaque. In other embodiments, opaque materials, such as titanium dioxide, can be added to dyed polymer layer 606 to make dyed polymer layer 606 partially or completely opaque without the use of a backing layer. In other embodiments, dyed polymer layer 606 is opaque on its own.

Figure 6D:
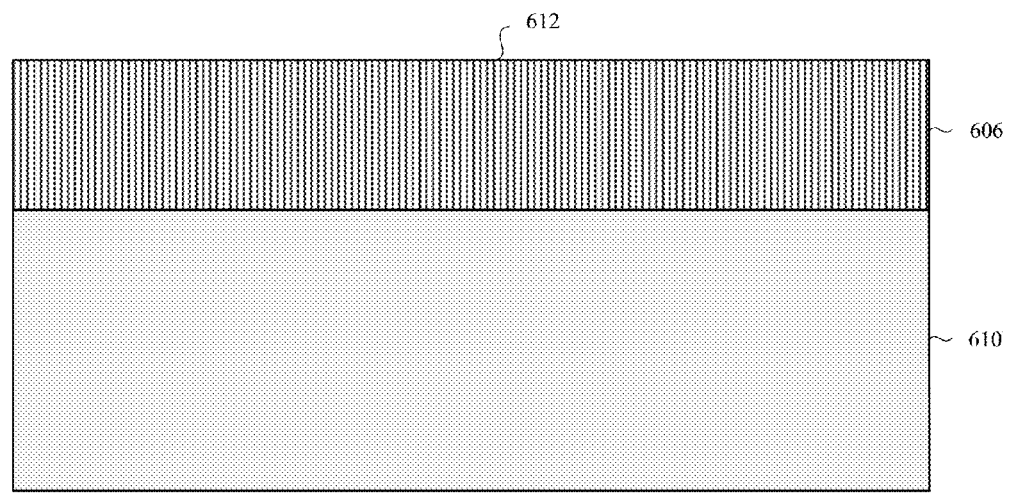

FIG. 6D shows dyed polymer layer 606 applied onto a surface of part 610. Dyed polymer layer 606 imparts a color to part 610 as viewed from top surface 612. The color imparted to part 610 corresponds to the color of the dye that is incorporated within dyed polymer layer 606. In some embodiments, dyed polymer layer 606 is cut or otherwise shaped to fit on a surface portion of part 610. In some cases dyed polymer layer 606 can be used to cover seams or defects on the surface of part 610. Dyed polymer layer 606 can be affixed to part 610 using any suitable method, including using of an adhesive (not shown). In some embodiments, a protective cover, such as a layer of plastic or glass, is adhered to top surface 612 of dyed polymer layer 606. Part 610 can be any suitable part, including an enclosure for a consumer electronic product. For example, dyed polymer layer 606 can be applied to track pad 108 of laptop 100 described above with reference to FIG. 1, frame portion 210 or RF windows 216 of mobile phone 200 described above with reference to FIG. 2. Since dyed polymer layer 606 is non-capacitive and RF transparent, dyed polymer layer 606 will not interfere with underlying track pad components and RF antennas. Dyed polymer layer 606 can provide a color to track pad 108, frame portion 210 or RF windows 216 that matches the color of surrounding dyed anodized metal portions, even when exposed to different types of light such as fluorescent light and natural daylight. The adjacent dyed anodized metal portions and dyed polymer layer 606 can also be subject to the same rate of UV fading over time.

Figure 6E:
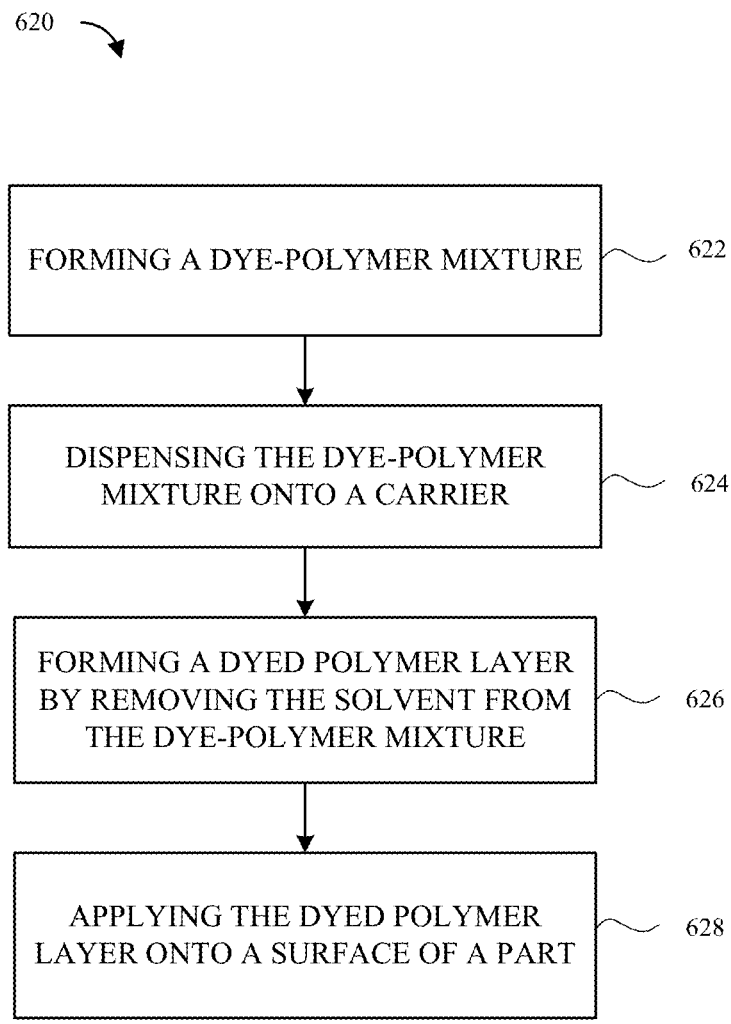
FIG. 6E shows a flowchart indicating formation of a dyed polymer layer, corresponding to FIGS. 6A-6D.

FIG. 6E shows flowchart 620 indicating formation of a dyed polymer layer, corresponding to FIGS. 6A-6D. At 622, a dye-polymer mixture is formed, as described above with reference to FIGS. 5A-5E. At 624, the dye-polymer mixture is dispensed as thin layer onto a carrier structure. The carrier structure can be substantially flat so as to form a substantially flat layer of dyed polymer. The dye-polymer mixture can be applied to a desired thickness using any suitable technique. At 626, the solvent within the dye-polymer mixture is removed using a solvent removing process forming a dyed polymer layer. In some embodiments, the solvent removing process involves heating and/or exposure to vacuum conditions. In some embodiments, the solvent removal process involves curing the dye-polymer mixture, further solidifying the dyed polymer layer. At 628, the dyed polymer layer is applied to a surface of a part. The dyed polymer layer can act as a color veneer to impart a color to an exposed surface of the part. The dyed polymer layer can be applied to a surface of the part adjacent a dyed anodized metal portion of the part. The same dye incorporated within the dyed anodized metal portion can be incorporated within the dyed polymer layer, thereby giving the part a uniform color, even when exposed to different types of light sources.

Returning back to FIG. 6B, in some embodiments, dyed polymer layer 606 can be used to form a composite layer that simulates the appearance of a dyed anodized metal substrate. FIGS. 7A-7D show cross-section views showing formation of an anodized metal appearing composite layer. At FIG. 7A, an optically reflective layer 702 is applied onto a first surface of dyed polymer layer 606. The thickness of dyed polymer layer 606 can be in the order of an anodic layer. In some embodiments, the thickness of dyed polymer layer 606 ranges from about from about 2 micrometers to about 150 micrometers. In one embodiment, the thickness of dyed polymer layer 606 ranges from about 15 micrometers to about 30 micrometers. In one embodiment, the thickness of dyed polymer layer 606 ranges from about 10 micrometers to about 24 micrometers. In one embodiment, the thickness of dyed polymer layer 606 ranges from about 26 micrometers to about 100 micrometers. As described above, dyed polymer layer 606 can have any suitable hardness, rigidity, flexibility, and elasticity characteristics. In embodiments where dyed polymer layer 606 is used in a roll-to-roll process, dyed polymer layer 606 can be relatively flexible so as to withstand flexing forces during handling and manipulating of the rolling process without cracking or breaking. For thicker applications where dyed polymer layer 510 is used as a support structure, such as portions of an enclosure, dyed polymer layer 510 can be relatively hard so as to resist deformation.

Dyed polymer layer 606 can be partially transparent such that reflective layer 702 is viewable therethrough. Optically reflective layer 702 can be made of any suitable optically reflective material. In some embodiments, reflective layer 702 is made of a material that is substantially non-electrically capacitive, non-thermally capacitive and/or RF transparent. In some embodiments, optically reflective layer 702 is partially optically transparent/translucent. In other embodiments, optically reflective layer 702 is substantially optically opaque. In some embodiments, optically reflective layer 702 includes ink or pigment that has metal flakes or mica flakes dispersed therein. The metal or mica flakes provide multiple visible light reflective surfaces that can be seen through dyed polymer layer 606 simulating the appearance of a dyed anodized metal substrate. Additionally, the metal flakes or mica flakes can create a textured look to optically reflective layer 702, thereby simulating the appearance of a dyed and textured anodized metal substrate. In some embodiments, an encapsulated metal flake ink is used, wherein the metal flakes are encapsulated within non-conductive material, such as silica. The encapsulated metal flakes are not able to form a bulk capacitive material or an RF-blocking material, and thus do not create a capacitive barrier or an RF-blocking barrier.

In some embodiments, optically reflective layer 702 includes a metallic or non-metallic coating that is applied using physical vapor deposition (PVD), chemical vapor deposition (CVD) and/or non-conductive vacuum metallization (NCVM) methods. Suitable metallic materials can include highly reflective metals such as tin or aluminum. The metallic material can be applied very thinly so that optically reflective layer 702 does not create a bulk capacitive material or an RF-blocking material. Suitable non-metallic materials can include metal oxides such as alumina or titania. In some embodiments, combinations of metallic and non-metallic materials are deposited onto the surface of dyed polymer layer 606.

Note that carrier 604 can have a surface 703 with any suitable smoothness or texture. In some embodiments, surface 703 is substantially flat or planar, giving dyed polymer layer 606 a correspondingly flat or planar surface formed during the solvent casting process described above with respect to FIGS. 6A-6D. In other embodiments, surface 703 of carrier 604 is textured, forming a correspondingly textured surface on dyed polymer layer 606 during the solvent casting process. In these embodiments, carrier 604 can be removed and optically reflective layer 702 can be deposited on the textured surface of dyed polymer layer 606. Optically reflective layer 702 can be conformally applied (e.g., via PVD or NCVM) to the textured surface, thereby simulating a underlying textured metal surface as viewed through dyed polymer layer 606.

At 7B, composite layer 700 is formed by removing carrier 604. Note that in alternative embodiments carrier 604 is removed prior to applying optically reflective layer 702. Composite layer 700 has an appearance of a colorized anodized metal surface as viewed from surface 703. Composite layer 700 can be applied onto a part as dyed anodized metal appearing veneer. For example, composite layer 700 can be incorporated into a part adjacent to an anodized metal portion, such as described above with reference to dyed polymer layer 606 at FIG. 6D. Composite layer 700 can be adhered to the part using, for example, an adhesive. If optically reflective layer 702 includes a non-electrically capacitive and RF transparent material, composite layer 700 can form exterior surfaces of capacitive track pads and/or RF windows. Composite layer 700 can have the appearance of a color-anodized metal to match surrounding anodized metal portions, but will not interfere with the functioning of the track pads or RF antennas. If optically reflective layer 702 includes a metallic material, composite layer 700 can form exterior surfaces of RF windows without interfering of the RF transmission to and/or from underlying RF antennas. Since the same dye used to dye the oxide layer can be incorporated into dyed polymer layer 606, dyed polymer layer 606 will color match the dyed oxide layer, even when illuminated with different types of light sources. The adjacent dyed anodized metal portions and dyed polymer layer 606 can also be subject to the same rate of UV fading over time.

Figure 7A:
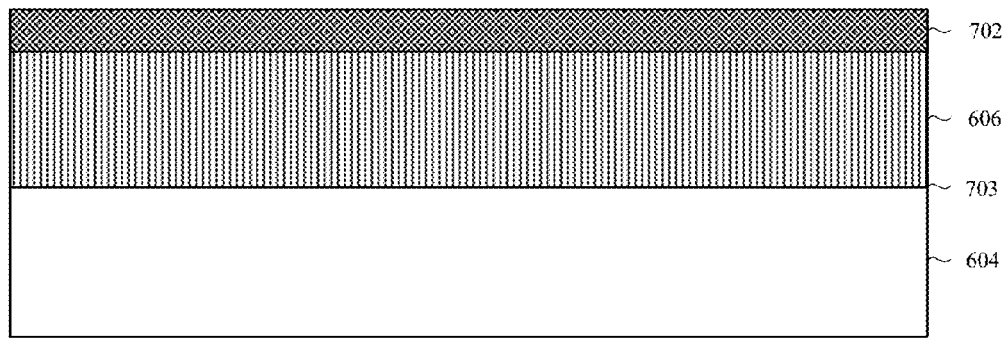
FIGS. 7A-7D show cross-section views of an anodized metal appearing composite layer formed using processes in accordance with some embodiments.
Figure 7B:
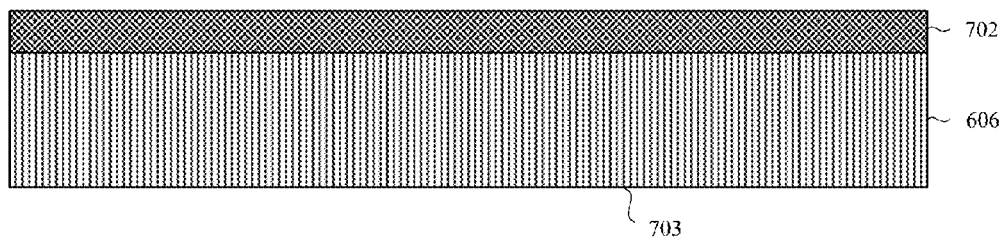
Figure 7C:
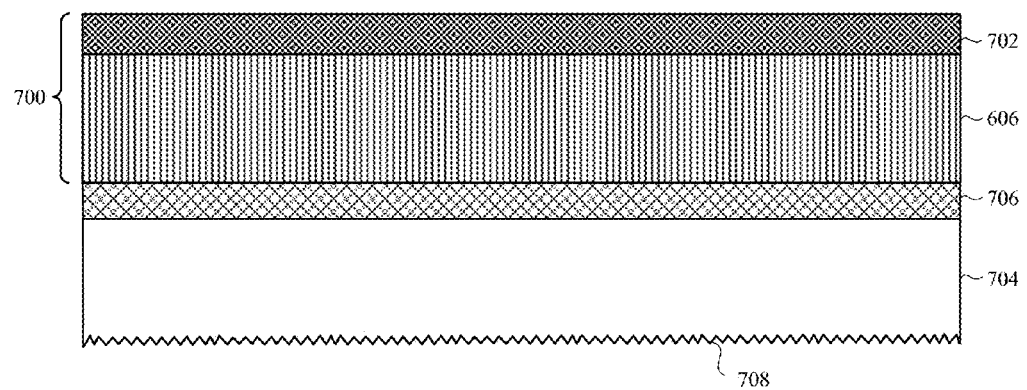

In some embodiments where dyed polymer layer 606 is not sufficiently durable for a particular application, a protective cover can be applied to composite layer 700. For example, dyed polymer 606 may not be sufficiently durable or be sufficiently abrasion or scratch resistant to be at the exterior surface of a consumer part, such as an enclosure for an electronic device. FIG. 7C shows optional protective cover 704 adhered to surface 703 of dyed polymer layer 606 using adhesive 706. Note that in some embodiments, dyed polymer layer 606 is made of a polymer material that sufficiently adheres to protective cover 704 without the use of a separate adhesive 706. For example, dyed polymer layer 606 made of certain polyvinyl butyral (PVB) materials can stick to protective cover 704 upon application of heat and/or pressure without the use of a separate adhesive.

Protective cover 704 can be substantially transparent or translucent to visible light in order to allow visibility of composite layer 700. Protective cover 704 can have any suitable thickness. In some embodiments, protective cover 704 has a thickness less than about 5 millimeters or less. In some embodiments, protective cover 704 has a thickness of about 1 millimeter. In some embodiments, protective cover 704 combined with dyed polymer layer 606 can have the appearance of a dyed anodic layer. In this way, in some embodiments protective cover 704 helps to simulate the appearance of an anodized metal substrate. In some embodiments, protective cover 704 is made of a non-conductive material such as glass or plastic. In some embodiments, protective cover 704 has a textured surface 708 formed using, for example, a blasting or chemical etching process. In other embodiments, surface 708 of protective cover 704 is non-textured and smooth. Adhesive 706 can be an optically clear adhesive such that composite layer 700 is viewable through adhesive 706.

Figure 7D:
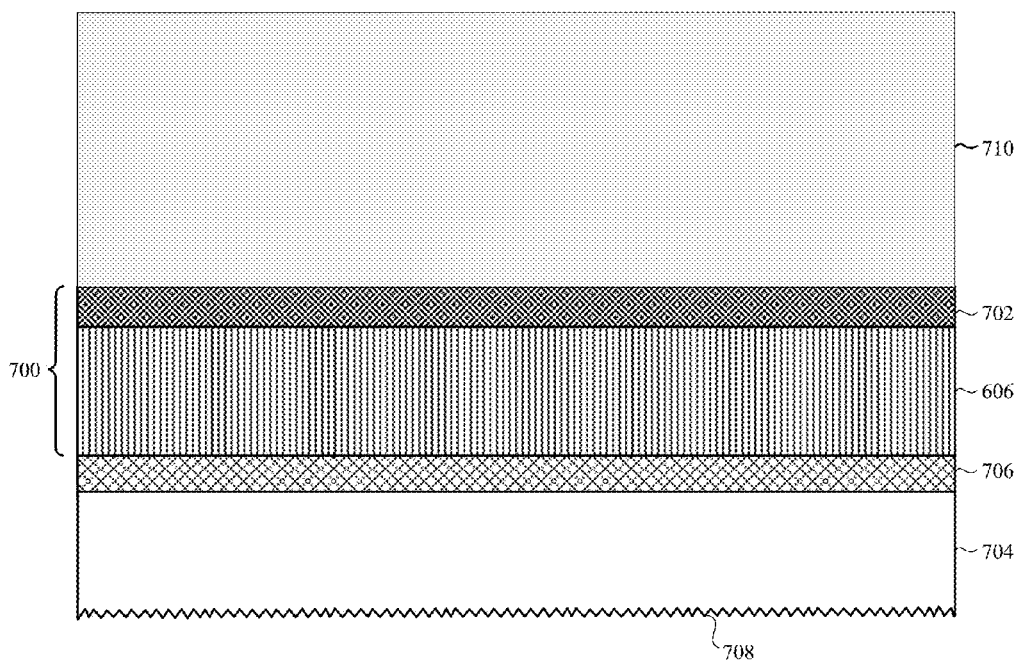

At FIG. 7D, protective cover 704 and composite layer 700 are applied onto a surface of part 710. Composite layer 700 can be affixed to part 710 using any suitable method, including using of an adhesive (not shown). Part 710 can be any suitable part, including an enclosure for a consumer electronic product. For example, protective cover 704 and composite layer 700 can be applied to track pad 108 of laptop 100 described above with reference to FIG. 1, frame portion 210 or RF windows 216 of mobile phone 200 described above with reference to FIG. 2. Since protective cover 704 and composite layer 700 can be designed to be non-capacitive and RF transparent, protective cover 704 and composite layer 700 will not interfere with underlying track pad components and RF antennas. Composite layer 700 can provide a color to track pad 108, frame portion 210 or RF windows 216 that matches the color of surrounding dyed anodized metal portions, even when exposed to different types of light such as fluorescent light and natural daylight. The adjacent dyed anodized metal portions and composite layer 700 can also be subject to the same rate of UV fading over time.

Figure 7E:
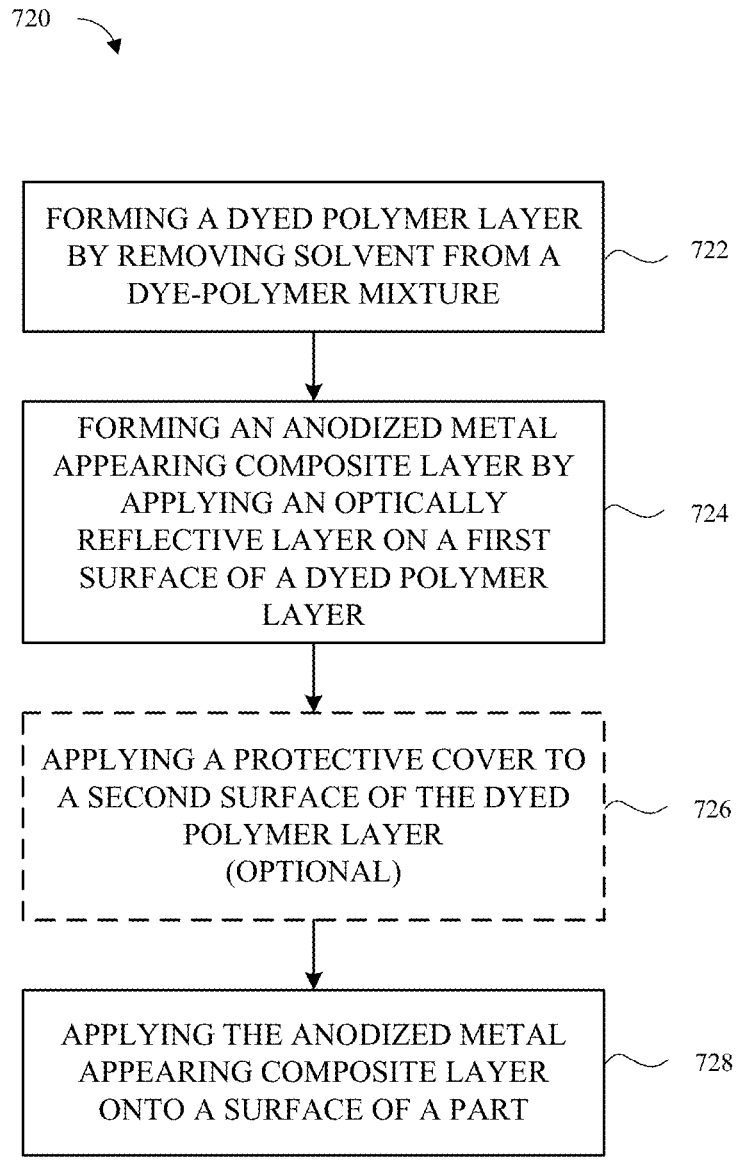
FIG. 7E shows a flowchart indicating formation of an anodized metal appearing composite layer, corresponding to FIGS. 7A-7D.

FIG. 7E shows flowchart 720 indicating formation of an anodized metal appearing composite layer, corresponding to FIGS. 7A-7D. At 722, a dyed polymer layer is formed, as described above with reference to FIGS. 6A-6B. The dyed polymer layer simulates the appearance of an oxide layer. Thus, the dyed polymer layer is preferably very thin, in some cases in the order of an oxide layer. If the dyed polymer layer is very thin, it may be beneficial to leave the dyed polymer layer on a carrier where the dyed polymer was formed in subsequent processing. The dyed polymer layer has a color corresponding to the dye incorporated therein and can be partially transparent. At 724, an optically reflective layer is applied on a first surface of the dyed polymer layer forming an anodized metal appearing composite layer. The optically reflective layer simulates the appearance of a metal substrate that can be seen through the dyed polymer layer. Thus, the composite structure has the appearance of a dyed anodized metal substrate. The optically reflective layer can be made of any suitable optically reflective material. In some embodiments, the optically reflective layer is made of a material that is substantially non-electrically capacitive, non-thermally capacitive and/or RF transparent. Suitable materials include inks or pigments that include mica or metal flakes, encapsulated metal flakes, or thin coatings of reflective metals. In some embodiments, the optically reflective layer is applied onto the first surface to a predetermined thickness. Any suitable application technique can be used, including one or more of brush-on, spin-on, spray-on, PVD, CVD and NCVM techniques.

At 726, a protective cover is optionally applied to a second surface of the dyed polymer layer. The protective cover can protect the underlying dyed polymer layer from damage if the dyed polymer layer is not sufficiently durable to resist damage. The protective cover can substantially transparent such that the underlying anodized appearing composite layer can be seen therethrough. In some embodiments, the protective cover is an electrically non-capacitive and/or RF transparent material, such as glass, plastic, fiberglass, ceramic or a combination thereof. The protective cover can have a smooth or textured (e.g., blasted) surface. The protective cover can have any suitable thickness. Note that the order of steps 724 and 726 described above can be performed in any order. For example, the protective cover can be adhered to the second surface of the dyed polymer layer prior to applying the reflective layer to the first surface of the dyed polymer layer.

At 728, the anodized metal appearing composite layer is applied to a surface of a part. The anodized metal appearing composite layer can act as a color veneer to impart a corresponding color to an exposed surface of the part. If a protective cover is adhered to the anodized metal appearing composite layer, both the anodized metal appearing composite layer and the protective cover are applied onto the surface of the part. The anodized metal appearing composite layer can be applied to a surface of the part adjacent a dyed anodized metal portion of the part. The same dye incorporated within the dyed anodized metal portion can be incorporated within the anodized metal appearing composite layer, thereby giving the part an appearance of an uninterrupted and uniform dyed anodized metal, even when exposed to different types of light sources.

Figure 8A:
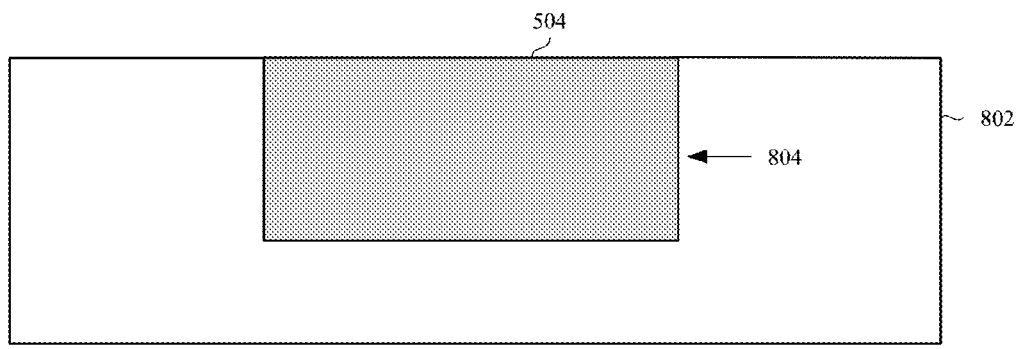
FIGS. 8A-8D show cross-section views of a dyed polymer structure formed using processes in accordance with some embodiments.

Returning to FIG. 5C, in some embodiments dye-polymer mixture 504 is used to form relatively large dyed polymer structures. The larger structures can be formed using, for example, a mold that provides the dyed polymer structure a predetermined three-dimensional shape. FIGS. 8A-8D show cross-section views of formation of a dyed polymer structure using a mold. FIG. 8A shows dye-polymer mixture 504 deposited within cavity 804 of mold 802. Cavity 804 has a three-dimensional shape that defines a shape of a resultant dyed polymer structure. For example, cavity 804 can have a shape of corresponding to a shape of an RF window, track pad or other portions of an enclosure. In a particular embodiment, cavity 804 has a shape that corresponds to an RF window, such as RF windows 216 of mobile phone 200 described above with reference to FIG. 2. Mold 802 can be made of any suitable material, such as a polymer material or a metallic material. In some embodiments, mold 802 is made of PET. In other embodiments, mold 802 is made of a heat retaining material such that heat can be applied to mold 802 and transferred to dye-polymer mixture 504 during a subsequent solvent removal process.

Figure 8B:
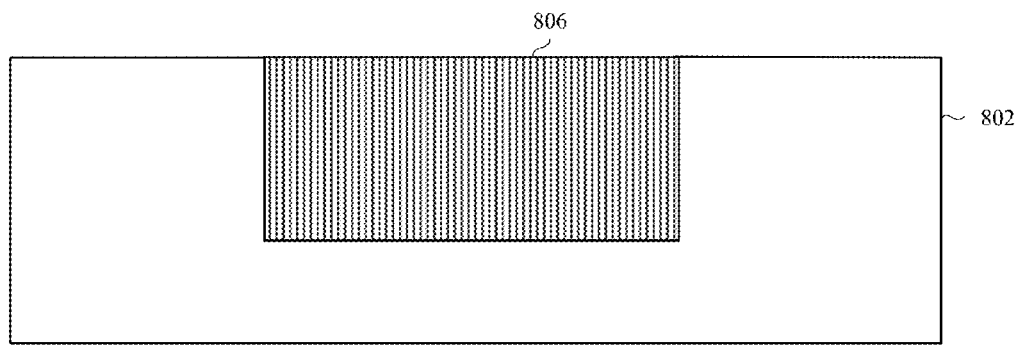

At FIG. 8B, removing the solvent from dye-polymer mixture 504 forms dyed polymer structure 806. The solvent can be removed by evaporation assisted by any suitable methods, such as by heating, exposure to vacuum conditions, or both. In some cases the heating involves curing dyed polymer structure 806. That is, the heating can additionally strengthen dyed polymer structure 806 during the solvent removal process. If a heating process is used, dyed polymer structure 806 should be heated to a temperature sufficient to remove the solvent but not so high as to destroy or substantially degrade dyed polymer structure 806 or adversely affect the quality/color of the contained dye. In one embodiment, dyed polymer structure 806 and mold 802 are placed in an oven to remove the solvent and cure structure 806. In some embodiments, solvent removal involves partial removal and solidification of dyed polymer structure 806 within mold 802, followed by removal of structure 806 from mold 802 and removal of the remainder of the solvent. This may be done if removing structure 806 from mold 802 can allow for faster removal of the solvent and/or curing of structure 806.

Figure 8C:
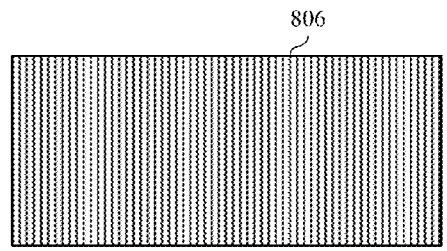

At FIG. 8C, dyed polymer structure 806 is removed from mold 802. At this point, dyed polymer structure can be further shaped to a desired final shape using, for example, a machining, polishing or other suitable shaping technique. Dyed polymer structure 806 can be a stand-alone part or it can be incorporated into a larger part. As described above, the polymer(s) used to form mixtures structure 806 can be chosen for its structural characteristics such as its hardness, rigidity, flexibility, and elasticity characteristics. Thus, in embodiments where structure 806 is used as a supportive structure, the relatively hard or rigid polymer(s) can be chosen so as to resist deformation.

Figure 8D:
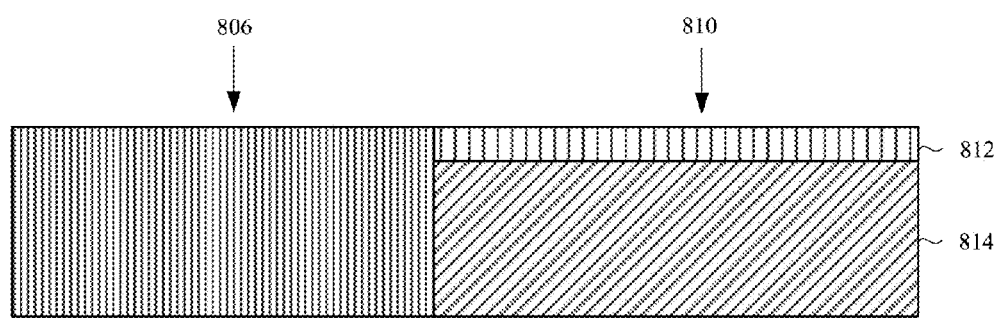

At FIG. 8D, dyed polymer structure 806 is incorporated into part 808 adjacent to anodized metal portion 810. Anodized metal portion 810 includes dyed oxide layer 812 over metal substrate 814. Dyed oxide layer 812 has the same type of dye incorporated therein as the dye incorporated within dyed polymer structure 806. In a particular embodiment, part 808 is an enclosure for an electronic device. For example, part 808 can correspond to an enclosure for a mobile phone, such as enclosure 202 of mobile phone 200 at FIG. 2. Dyed polymer structure 806 can correspond to one of RF windows 216 and anodized metal portion can correspond to one of anodized metal back portion 204 or side portions 206. Since dyed polymer structure 806 includes the same type of dye that is incorporated within dyed oxide layer 812, dyed polymer structure 806 will color-match dyed oxide layer 812, even when exposed to different types of light, such as fluorescent light and natural daylight. The adjacent dyed oxide layer 812 and dyed polymer structure 806 can also be subject to the same rate of UV fading over time. In some embodiments, a substantially transparent protective cover, such as a layer of plastic or glass, is adhered to a top surface of dyed polymer structure 806.

Figure 8E:
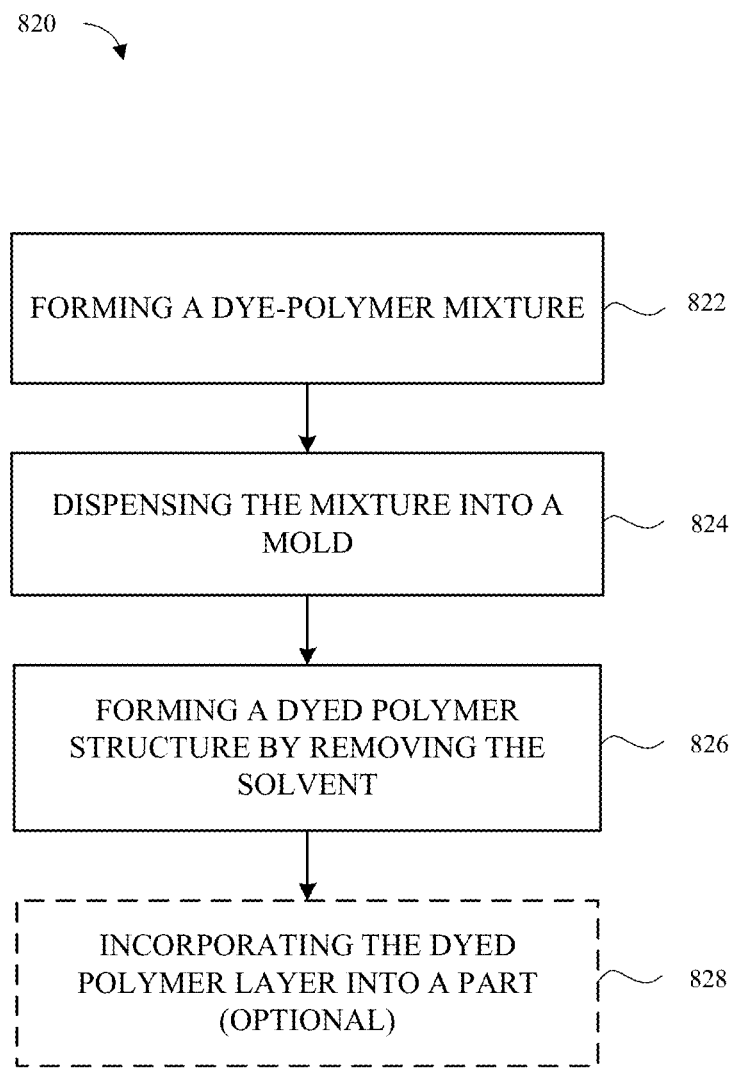
FIG. 8E shows a flowchart indicating formation of dyed polymer structure, corresponding to FIGS. 8A-8D.

FIG. 8E shows flowchart 820 indicating formation of dyed polymer structure, corresponding to FIGS. 8A-8D. At 822, a dye-polymer mixture is formed, as described above with reference to FIGS. 5A-5E. At 824, the dye-polymer mixture is dispensed into a mold. The mold can have a three-dimensional shape corresponding to a final or near-final shape of the dyed polymer structure. The dye-polymer mixture can be deposited into the mold using any suitable technique, including pouring, injection molding or pressured injection molding. At 826, the solvent within the dye-polymer mixture is removed using a solvent removing process forming a dyed polymer structure. In some embodiments, the solvent removing process involves heating the dyed-polymer mixture and/or exposing the dyed-polymer mixture to vacuum conditions. In some embodiments, the solvent removal process involves curing the dye-polymer mixture, further solidifying the dyed polymer structure. In some embodiments, the dyed polymer structure is removed from the mold prior to full removal of the solvent. After substantially all the solvent is removed and the dyed polymer structure is sufficiently hardened, an optional shaping process is used to further shape the dyed polymer structure. The shaping process can include a machining and/or polishing process. In some embodiments, a protective cover, such as a transparent glass or plastic, is adhered to the dyed polymer structure.

At 828, the dyed polymer structure is optionally incorporated into a part. In alternative embodiments, the dyed polymer structure is a stand-alone part. The dyed polymer structure can be positioned adjacent a dyed anodized metal portion of the part. The same dye incorporated within the dyed anodized metal portion can be incorporated within the dyed polymer structure, thereby giving the part a uniform color, even when exposed to different types of light sources. If a protective cover is used, the protective cover and the dyed polymer structure can be incorporated into the part such that the protective cover corresponds to an exterior surface of the part.

Figure 9:
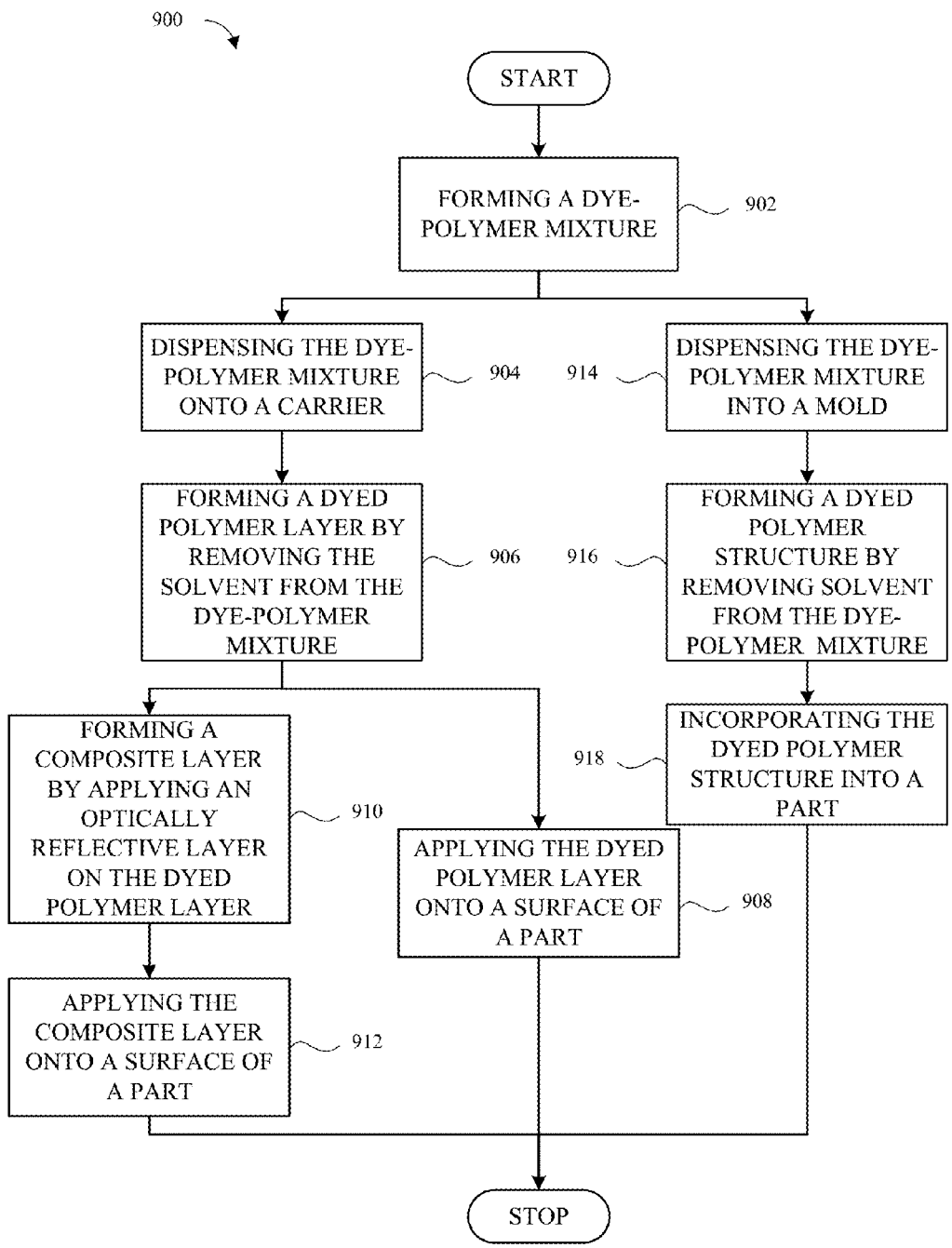
FIG. 9 shows a flowchart indicating a general scheme for forming dyed polymer layers and structures in accordance with some embodiments.

FIG. 9 shows flowchart 900 indicating a general scheme of for forming dyed polymer layers and structures using described embodiments. At 902, a dye-polymer mixture is formed using by dissolving one or more polymers and one or more dyes within one or more solvents. The dye can be the same type of dye used in a non-polymer material, such as a water-soluble dye used in an anodic film. In some embodiments, forming the dye-polymer mixture involves forming two separate mixtures: forming a first mixture containing the one or more polymers within one or more solvents, and forming a second mixture containing the one or more dyes within one or more solvents. The first and second mixtures are then combined to form the dye-polymer mixture.

If a thin layer or film of dyed polymer is to be formed, at 904 the dye polymer mixture is dispensed onto a carrier. At 906, the solvent or solvents are removed from the dye-polymer mixture forming a dyed polymer layer. At 908, the dyed polymer layer can then be applied onto a surface of a part. The dyed polymer layer can act as a color veneer to impart a color to the part. In some embodiments, the composite layer is applied onto a portion of the part adjacent an anodized metal portion. The color of the dyed polymer layer can match the color of the non-polymer material. Since the same type of dye can be used, the dyed polymer layer can have substantially the same reflection/transmission curves as the non-polymer material using different typed of sources of illumination.

If an anodized metal appearing layer is desired, at 910 an optically reflective layer is applied onto a surface of the dyed polymer layer, forming an anodized metal appearing composite layer. The dyed polymer layer simulates the appearance of a dyed anodic film while the optically reflective layer simulates the appearance of an underlying metal substrate. At 912, the composite layer is applied onto a surface of a part. In some embodiments, the composite layer is applied onto a portion of the part adjacent a dyed anodized metal portion. The color of the dyed polymer layer of the composite layer can match the color of the dyed anodized metal portion. Since the same type of dye can be used, the dyed polymer layer can have substantially the same reflection/transmission curves as the dyed anodic film of the anodized metal portion using different typed of sources of illumination. In addition, the reflective layer of the composite layer provides an appearance of an underlying substrate.

If a larger dyed polymer structure is desired, at 914, the dye-polymer mixture is dispensed into a mold. The mold can have a three-dimensional shape that will give the dye polymer structure a corresponding shape. At 916, the solvent or solvents are removed from the dye-polymer mixture forming a dyed polymer structure. After the solvent is sufficiently removed, the dyed polymer structure can be removed from the mold. The dyed polymer structure can act as a stand-alone part, or at 918, the dyed polymer structure can be incorporated into a part. In some embodiments, the dyed polymer structure is positioned adjacent a non-polymer material, such as a dyed anodized metal portion. The color of the dyed polymer structure can match the color of the non-polymer material. Since the same type of dye can be used, the dyed polymer structure can have substantially the same reflection/transmission curves as the non-polymer material using different typed of sources of illumination.

Figure 10A:
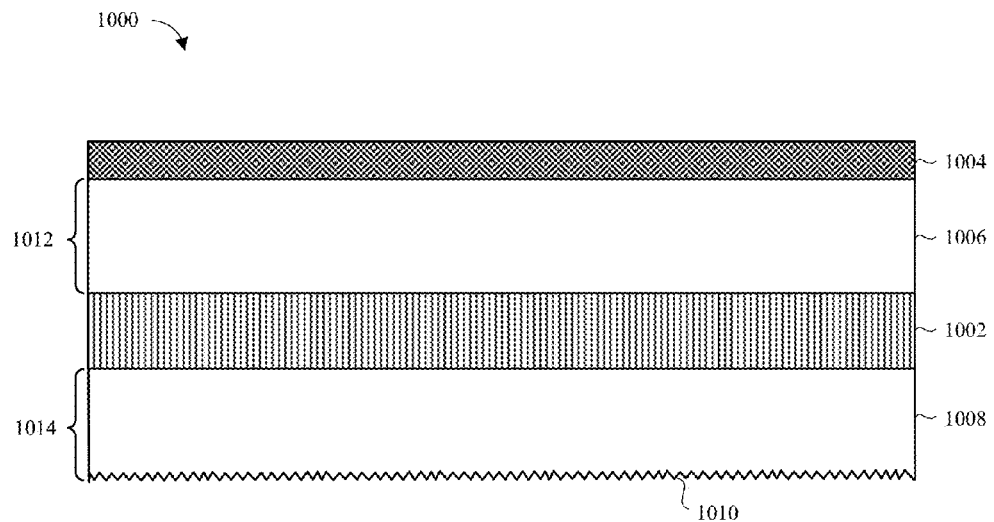
FIGS. 10A-10D show cross-section views of laminated stack up structures that each includes a dyed polymer layer sandwiched between protective covers.

According to some embodiments, a dyed polymer layer is positioned between protective covers in order to protect the dyed polymer layer from exposure to elements such as moisture or other contaminants. FIGS. 10A-10D show various laminated stack up embodiments in which the dyed polymer layer is arranged between protective covers. FIG. 10A shows laminated stack up 1000, which includes dyed polymer layer 1002 positioned between first protective cover 1006 and second protective cover 1008. In this way, dyed polymer layer 1002 can be referred to as "sandwiched" between first protective cover 1006 and second protective cover 1008. First protective cover 1006 and second protective cover 1008 can protect opposing sides of dyed polymer layer 1002 from exposure to elements such as air, water, oil, dirt and/or other contaminants. Another advantage to the sandwiched configuration of laminated stack up 1000 is that dyed polymer layer 1002 is protected from external forces that can cause peeling off or delamination of dyed polymer layer 1002.

Dyed polymer layer 1002 can be formed using any of the above-described methods and can be designed to have a color to match a color of a non-polymer material, such as a dyed anodized metal. In some embodiments, dyed polymer layer 1002 is optically translucent. Dyed polymer layer 1002 can be made of a material that also functions as an adhesive such that dyed polymer layer 1002 adheres to first protective cover 1006 and second protective cover 1008. For example, dyed polymer layer 1002 can be made of a PVB material that adheres to first protective cover 1006 and second protective cover 1008 upon application of heat and/or pressure. In some cases, keeping dyed polymer layer 1002 as thin as possible and choosing a material for dyed polymer layer 1002 that has a high shear modulus provides good coupling to first protective cover 1006 and second protective cover 1008.

In some embodiments, dyed polymer layer 1002 is made of an ethylene vinyl acetate (EVA) material. This is because in some applicants EVA has shown to have higher humidity resistance than PVB material and can thereby perform better than a PVB material. In some embodiments, dyed polymer layer 1002 includes multiple layers of polymer materials. For example, dyed polymer layer 1002 can include multiple layers of PVB and EVA. In a particular embodiment, dyed polymer layer 1002 includes a layer of PVB material sandwiched between two EVA material layers. That is, each of the two EVA layers are in contact with first protective cover 1006 and second protective cover 1008, respectively, with the layer of PVB material positioned between the two EVA layers. This sandwiched configuration can provide the improved humidity resistance properties of EVA while providing the optically clear or translucent quality of PVB. In a different embodiment, dyed polymer layer 1002 includes a layer of PET material sandwiched between two EVA material layers.

Optically reflective layer 1004 is positioned on an opposing side of first protective cover 1006 and can provide a metallic appearance such that, when viewed from exposed surface 1010 of second protective cover 1008, laminated stack up 1000 has the appearance of a dyed anodized metal. Optically reflective layer 1004 can bonded to first protective cover 1006 using any suitable method, including a printing process, PVD, CVD and/or NCVM. As in embodiments described above, laminated stack up 1000 can be applied to a surface of a part to give the part an appearance of a dyed anodized metal. In some embodiments, surface 1010 of second protective cover 1008 has a textured surface, such as a blasted or chemically etched surface texture. In other embodiments, surface 1010 is smooth or polished (not shown). Optically reflective layer 1004 can be substantially opaque or can be partially transparent.

One or both of first protective cover 1006 and second protective cover 1008 can be made of an optically transparent or translucent material(s). For example, one or both of first protective cover 1006 and second protective cover 1008 can be made of glass or optically transparent/translucent plastic. In some cases, first protective cover 1006 and second protective cover 1006 are made of substantially the same material. This way, first protective cover 1006 and second protective cover 1006 will have substantially the same coefficient of thermal expansion. In other cases, first protective cover 1006 and second protective cover 1008 can be made of different materials to accomplish different functional properties. For example, first protective cover 1006 can be made of a first material chosen for its mechanical properties, such as stiffness and/or hardness, while second protective cover 1008 can be made of a second material chosen for its transparency. In some cases, first protective cover 1006 and second protective cover 1008 are made of different materials but have similar coefficients of thermal expansion. First protective cover 1006 should be transparent enough such that optically reflective layer 1004 is viewable therethrough. In one embodiment, second protective cover 1008 is made of an optically transparent glass or plastic and first protective cover 1006 is made of one or more of carbon fiber, ceramic, glass, sapphire and plastic.

Thickness 1012 of first protective cover 1006 and thickness 1014 of second protective cover 1008 can each be any suitable thickness and can depend on particular application requirements. For example, in some applications second protective cover 1008 corresponds to an exposed surface 1010 that is subject to impacts, wear, abrasion and/or scratching. In these cases, thickness 1012 of first protective cover 1008 can be chosen to be thick enough to adequately protect dyed polymer layer 1002 from such impacts, wear, abrasion and/or scratching. On the other hand, thickness 1012 can be chosen to be as thin and as close to a thickness of an anodized metal layer as possible in order to simulate the appearance of an anodized metal surface. These factors should be weighed when designing laminated stack up 1000 for a particular application.

Thickness 1014 of second protective cover 1008 can be chosen such that second protective cover adequately blocks contaminants such as moisture, dirt and/or oils from reaching dyed polymer layer 1002. For example, dyed polymer layer 1002 may be susceptible to losing adhesive properties when exposed to moisture, in which case second protective cover is configured to adequately block moisture from reaching dyed polymer layer 1002. In some embodiments, thickness 1012 of first protective cover 1006 is substantially the same as thickness 1014 of second protective cover 1008. In some cases where thickness 1012 is different than thickness 1014, laminated stack up 1000 can have a greater overall stiffness compared to having thickness 1012 the same as thickness 1014. In some embodiments, thickness 1012 and thickness 1014 are each less than about 1 millimeter. In one embodiment, the combined thickness of thickness 1012 and thickness 1014 is about 1 millimeter, with thickness 1014 greater than thickness 1012. In another embodiment, the combined thickness of thickness 1012 and thickness 1014 is about 1 millimeter, with thickness 1012 greater than thickness 1014. In some cases since dyed polymer layer 1002 is generally made of more flexible material than first 1006 and second 1008 protective covers, laminated stack up 1000 can act similar to safety glass when broken. That is, if first 1006 and/or second 1008 protective covers are broken, the broken pieces can be held in place by dyed polymer layer 1002 preventing scattering of the broken pieces.

Figure 10B:
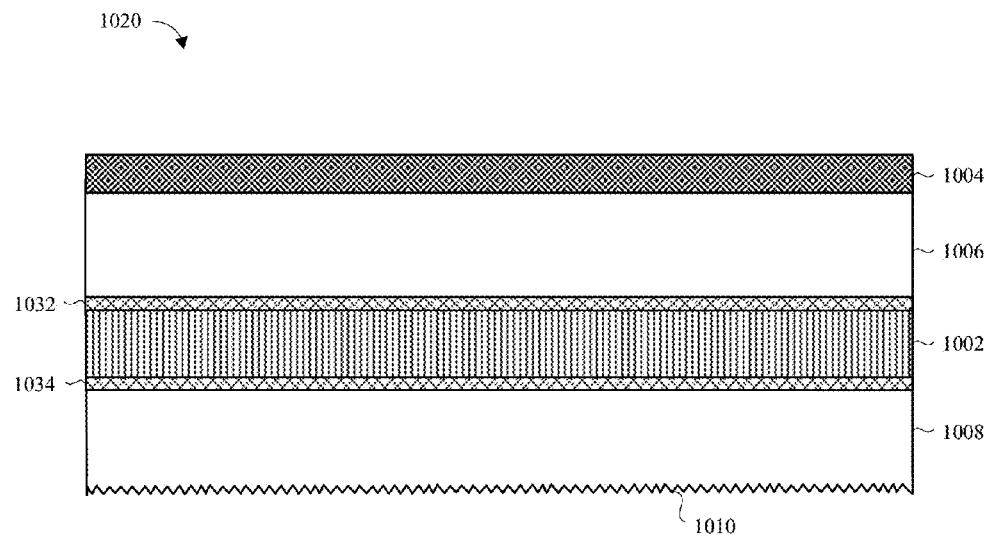

FIG. 10B shows laminated stack up 1020, which has a similar layered arrangement as laminated stack up 1000 but which includes intermediate adhesive layers. Like laminated stack up 1000, laminated stack up 1020 includes dyed polymer layer 1002 sandwiched between first protective cover 1006 and second protective cover 1008. Optically reflective layer 1004 is positioned on an opposing side of first protective cover 1006 and can provide a metallic appearance such that, when viewed from exposed surface 1010 of second protective cover 1008, laminated stack up 1020 has the appearance of a dyed anodized metal. Surface 1010 of second protective cover 1008 can be textured or smoothed/polished (not shown). As described above, in some embodiments where dyed polymer layer 1002 is not particularly adhesive, a separate adhesive can be used to bond the dyed polymer layer 1002 to first protective cover 1006 and second protective cover 1008. For example, some polycarbonate materials can be less adhesive and require a separate adhesive to adequately bond with first protective cover 1006 and second protective cover 1008. Accordingly, FIG. 10B shows first adhesive 1032 that bonds dyed polymer layer 1002 first protective cover 1006, and second adhesive 1034 that bonds dyed polymer layer 1002 to second protective cover 1008. In some embodiments, one or both of first adhesive 1032 and second adhesive 1034 are substantially transparent.

In a particular embodiment, one or both of first adhesive 1032 and second adhesive 1034 include one or both of a liquid optically clear adhesive or a film-type adhesive. Liquid optically clear adhesive can have the advantage of allowing for a very thin laminate to be applied that can accommodate small amounts of waviness that exist in first protective cover 1006 and/or second protective cover 1008 without creating bubbles. In some embodiments, one or both of first adhesive 1032 and second adhesive 1034 include a pressure sensitive adhesive (PSA), such as an optically clear PSA. One advantage of using a PSA or a non-thermally cured liquid optically clear adhesive is that a thermal bonding process can be eliminated, thereby simplifying the process for forming laminated stack up 1020. In addition, eliminating a thermal bonding process can prevent any potential degrading of dye colors due to a thermal processing. PSA materials have an advantage of a very low modulus that can provide good shock absorption for laminated stack up 1020. On the other hand, thermally cured liquid optically clear adhesives can have a very high modulus, which can better match the modulus of first protective cover 1006 and/or second protective cover 1008 and provide desirable functional properties for certain applications, such as structural glass panels. These and other considerations should be accounted for when choosing first adhesive 1032 and second adhesive 1034 for a particular application.

According to a particular embodiment, dyed polymer layer 1002 includes a PVB material and each of first adhesive 1032 and second adhesive 1034 includes PSA. In another embodiment, dyed polymer layer 1002 includes a PET material and each of first adhesive 1032 and second adhesive 1034 includes PSA. According to a different particular embodiment, dyed polymer layer 1002 includes a PVB material and each of first adhesive 1032 and second adhesive 1034 includes a liquid optically clear adhesive. In another embodiment, dyed polymer layer 1002 includes a PET material and each of first adhesive 1032 and second adhesive 1034 includes a liquid optically clear adhesive.

Figure 10C:
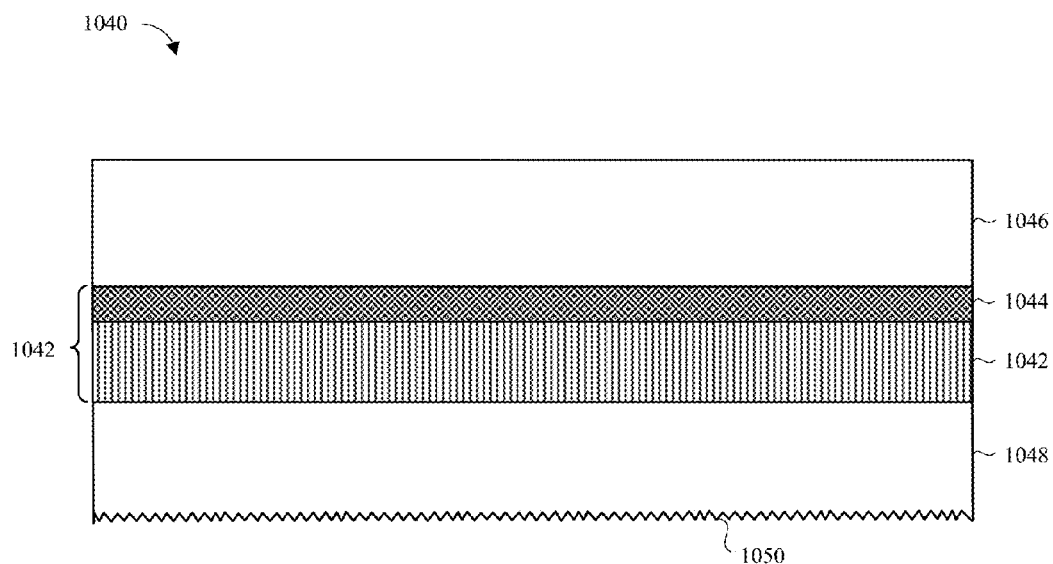

FIG. 10C shows laminated stack up 1040, which includes dyed polymer layer 1042 and optically reflective layer 1044 both positioned between first protective cover 1046 and second protective cover 1048. In this way, dyed polymer layer 1042 and optically reflective layer 1044 are both protected from external forces that can peel off dyed polymer layer 1042 or optically reflective layer 1044. Dyed polymer layer 1042, optically reflective layer 1044, first protective cover 1046 and second protective cover 1048 can each be formed using any of the methods described above and can have any suitable thickness and be made of any suitable material based on requirements for particular applications. Surface 1050 of second protective cover 1048 can be textured, as shown, or can be smooth or polished (not shown). Dyed polymer layer 1042 can include any suitable material, including PET, PVB, PVA and any suitable combination thereof, similar to as described above with reference to FIG. 10A.

Optically reflective layer 1044 is positioned behind dyed polymer layer 1042 and can give laminated stack up 1040 an appearance of a dyed anodized metal as viewed from surface 1050. Laminated stack up 1040 can have a different appearance than laminated stack ups 1000 and 1020 described above since optically reflective layer 1044 is positioned directly behind dyed polymer layer 1042. Optically reflective layer 1004 can be substantially opaque or can be partially transparent. Since first protective cover 1046 is positioned behind optically reflective layer 1044 relative to viewing surface 1050, optically reflective layer 1044 can visually hide first protective cover 1046 depending upon how opaque optically reflective layer 1044 is. Thus, in cases where optically reflective layer is substantially completely opaque, the transparency and/or color of first protective cover 1046 are unimportant and the material chosen for first protective cover 1046 can be chosen solely based on other functional properties such as stiffness or hardness. In cases where optically reflective layer 1044 is partially transparent, first protective cover 1046 can also be chosen for its optically reflectivity or color. For example, first protective cover 1046 can be made of a highly reflective or bright color (e.g., white) that can enhance the simulated appearance of an underlying metal.

Figure 10D:
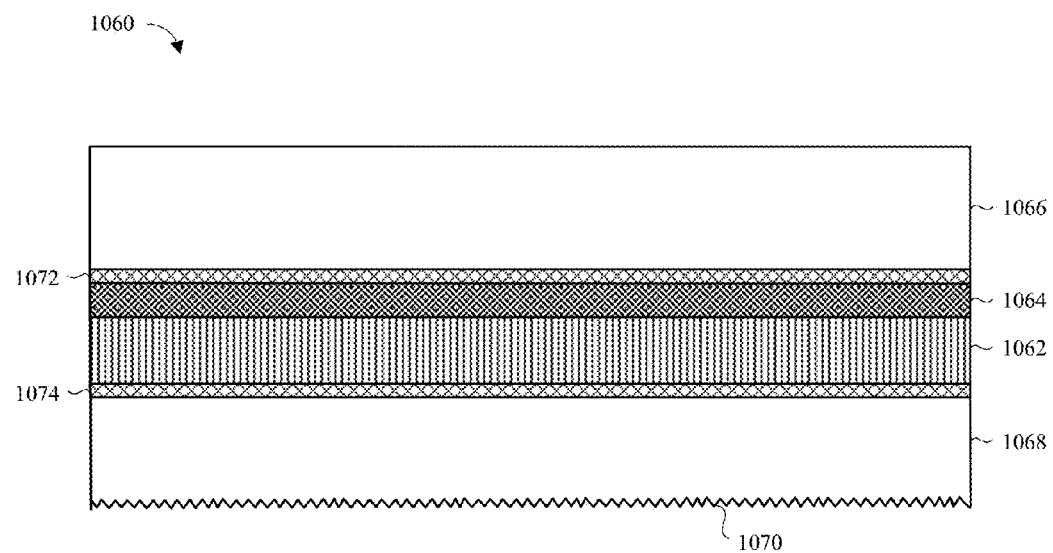

FIG. 10D shows laminated stack up 1060, which has a similar layered arrangement as laminated stack up 1040 but which includes intermediate adhesive layers. Like laminated stack up 1040, laminated stack up 1060 includes dyed polymer layer 1062 and optically reflective layer 1064 sandwiched between first protective cover 1066 and second protective cover 1068. Surface 1070 of second protective cover 1068 can optionally be textured, or can be smoothed/polished (not shown). As described above, in some cases dyed polymer layer 1062 is made of a material that does not adequately bond to substrates without the use of adhesives. In these cases, first adhesive 1072 can be used to bond optically reflective layer to first protective cover 1066 and second adhesive 1074 can be used to bond dyed polymer layer 1062 to second protective cover 1068. Optically reflective layer 1064 can be applied onto dyed polymer layer 1062 using, for example, a printing process. In other cases, optically reflective layer 1064 is applied onto dyed polymer layer 1062 using another adhesive (not shown). In some embodiments, adhesives 1072 and/or 1074 are substantially transparent. In a particular embodiment, adhesives 1072 and/or 1074 include one or both of a liquid optically clear adhesive or a film-type adhesive. Dyed polymer layer 1062 can include any suitable material, including PET, PVB, PVA and any suitable combination thereof, similar to as described above with reference to FIG. 10B. In addition, one or both of first adhesive 1072 and second adhesive 1074 can include any suitable adhesive material, as described above with respect to FIG. 10B.

Figure 11:
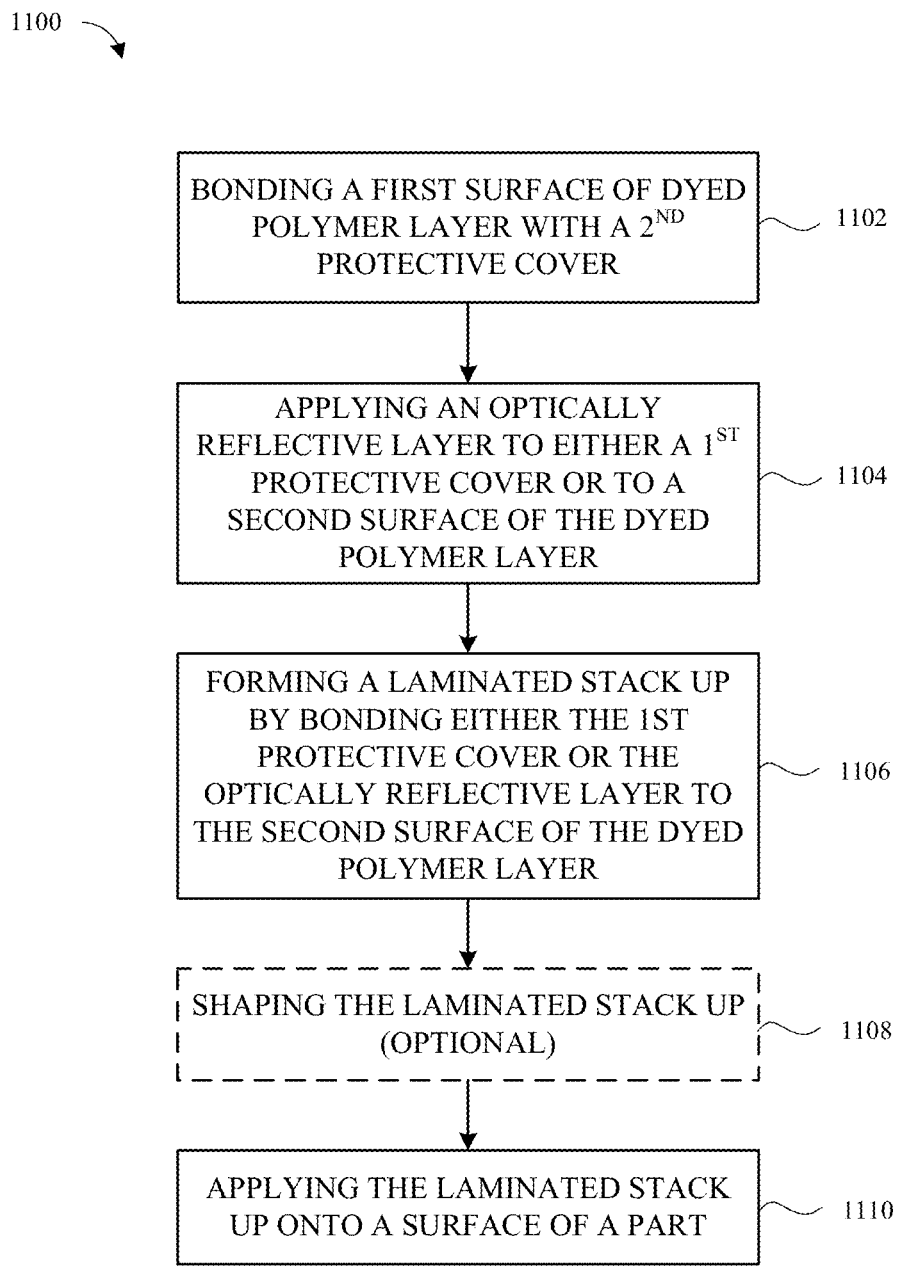
FIG. 11 shows a flowchart indicating a process for forming a laminated stack up, such as illustrated in each of FIGS. 10A-10D.

FIG. 11 shows flowchart 1100 indicating a process for forming a laminated stack up such as laminated stack ups 1000, 1020, 1040 and 1060 described above with reference to FIGS. 10A-10D. At 1102, a first surface of a dyed polymer layer is bonded with a second protective cover. The second protective cover has and external surface opposite the surface that the dyed polymer layer is bonded that corresponds to a viewing surface of the laminated stack up. In some embodiments, the dyed polymer layer is made of a polymer that is sufficiently adhesive to bond directly with the second protective cover. In other embodiments, a separate adhesive, such as an optically clear adhesive, is used to provide sufficient bonding.

At 1104, an optically reflective layer is applied to either a first protective cover or to a second surface of the dyed polymer layer. The optically reflective layer can be applied using any suitable process and can depend on whether the optically reflective layer is applied onto the first protective cover or the dyed polymer layer since they are made of different materials. If the optically reflective layer is applied onto the first protective layer, suitable processes can include printing, PVD, CVD and/or NCVM processes or use of a separate adhesive. If the optically reflective layer is applied onto the dyed polymer layer, suitable processes can include a printing process or by use of a separate adhesive.

At 1106, the laminated stack up is formed by bonding either the first protective cover or the optically reflective layer to the second surface of the dyed polymer layer. If the dyed polymer layer is an adhesive-type polymer (e.g., PVB and/or EVA), the dyed polymer layer can be directly adhered with either the first protective cover or the optically reflective layer. In some embodiments, a separate adhesive can be used to bond with the dyed polymer layer.

At 1108, the laminated stack up is optionally shaped to a predetermined shape. For example, the laminated stack up can be cut to have a shape in accordance with a track pad or an RF window for an electronic device. At 1110, the laminated stack up is applied onto a surface of part, such as the electronic devices described above with reference to FIGS. 1 and 2. The laminated stack up can act as a color veneer to impart a color to an exposed surface of the part. The laminated stack up can be applied to a surface of the part adjacent a dyed anodized metal portion of the part. The same dye incorporated within the dyed anodized metal portion can be incorporated within the dyed polymer layer of the laminated stack up, thereby giving the part a uniform color, even when exposed to different types of light sources.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. An enclosure for an electronic device, the enclosure comprising:
   an anodized metal portion with an anodic dye infused therein; and
   a non-electrically capacitive portion having an appearance similar to the anodized metal portion, the non-electrically capacitive portion including a laminated stack-up, the laminated stack-up comprising:
   an optically reflective layer, a first protective cover, a dyed polymer layer having the anodic dye infused therein such that the dyed polymer layer color-matches the anodized metal portion, and a second protective cover having an outer surface corresponding to a viewing surface of the laminated stack-up, wherein the dyed polymer layer is positioned between the first protective cover and the second protective cover, and wherein the first protective cover is positioned between the optically reflective layer and the dyed polymer layer, wherein the first protective cover, the dyed polymer layer, and the second protective cover are sufficiently optically translucent such that the optically reflective layer is observable from the viewing surface.

2. The enclosure of claim 1, wherein the dyed polymer layer has a thickness of about 2 micrometers to about 150 micrometers.

3. The enclosure of claim 2, wherein the first protective cover and the second protective cover each have a thickness of less than about one millimeter.

4. The enclosure of claim 1, wherein the optically reflective layer is composed of an encapsulated metal flake ink having metal flakes encapsulated within a non-conductive material.

5. The enclosure of claim 1, wherein the viewing surface has a blasted or a chemically etched texture.

6. The enclosure of claim 1, wherein the non-electrically capacitive portion corresponds to a touch input portion of the enclosure configured to accept touch input from a user of the electronic device.

7. The enclosure of claim 6, wherein the touch input portion is configured to be positioned over a touch pad or touch screen within the enclosure of the electronic device.

8. An enclosure for an electronic device, the enclosure comprising:

an anodized metal portion having an anodic film with an anodic dye infused therein; and a non-electrically capacitive portion having an appearance similar to the anodized metal portion, the non-electrically capacitive portion including a laminated stack-up, the laminated stack-up comprising:

an optically reflective layer, a first protective cover comprised of a first material, a dyed polymer layer having the anodic dye infused therein such that the dyed polymer layer color-matches the anodized metal portion, and a second protective cover comprised of a second material, the second protective cover having an outer surface corresponding to a viewing surface of the laminated stack up, wherein the dyed polymer layer is positioned between the first protective cover and the second protective cover, and wherein the first protective cover is positioned between the optically reflective layer and the dyed polymer layer, wherein the first protective cover, the dyed polymer layer, and the second protective cover are sufficiently optically translucent such that the optically reflective layer is observable from the viewing surface.

9. The enclosure of claim 8, wherein the first protective cover and the second protective cover each have a thickness of less than about one millimeter.

10. The enclosure of claim 8, wherein a first adhesive bonds the optically reflective layer to the first protective cover and a second adhesive bonds the dyed polymer layer to the second protective cover.

11. The enclosure of claim 8, wherein the optically reflective layer is composed of an encapsulated metal flake ink having metal flakes encapsulated within a non-conductive material.

12. The enclosure of claim 8, wherein the first material is substantially the same as the second material.

13. The enclosure of claim 8, wherein the first material and the second material are comprised of at least one of a glass and plastic.

14. The enclosure of claim 8, wherein the first material is different than the second material.

15. An enclosure for an electronic device, the enclosure comprising:

an anodized metal portion having an anodic film with an anodic dye infused therein; and a non-electrically capacitive touch input portion configured to accept touch input from a user of the electronic device, the non-electrically capacitive touch input portion having an appearance similar to the anodized metal portion, the non-electrically capacitive touch input portion including a laminated stack-up comprising:

an optically reflective layer, a first protective layer, a dyed polymer layer having the anodic dye infused therein such that the dyed polymer layer color-matches the anodized metal portion, and a second protective layer having an outer surface corresponding to a viewing surface of the laminated stack-up, wherein the dyed polymer layer is positioned between the first protective layer and the second protective layer, and wherein the first protective layer is positioned between the optically reflective layer and the dyed polymer layer, wherein the first protective layer, the dyed polymer layer, and the second protective layer are sufficiently optically translucent such that the optically reflective layer is observable from the viewing surface.

16. The enclosure of claim 15, wherein the dyed polymer layer has a thickness of about 2 micrometers to about 150 micrometers.

17. The enclosure of claim 15, wherein the first protective layer and the second protective layer each have a thickness of less than about one millimeter.

18. The enclosure of claim 15, wherein the optically reflective layer is composed of an encapsulated metal flake ink having metal flakes encapsulated within a non-conductive material.

19. The enclosure of claim 15, wherein the viewing surface has a blasted or a chemically etched texture.

20. The enclosure of claim 15, wherein the first protective layer is composed of a different material than the second protective layer.

* * * * *